US012677395B2

(12) United States Patent
Jacks et al.

(10) Patent No.: US 12,677,395 B2
(45) Date of Patent: Jul. 7, 2026

(54) HEAT EXCHANGER AND SMALL CELL RADIO NODE INCORPORATING THE SAME

(71) Applicant: ANI Acquisition Sub, LLC, Boca Raton, FL (US)

(72) Inventors: John Richard Jacks, Wellington, OH (US); Akshay Parmar, Pune (IN); Lucas Wayne Yeary, Corning, NY (US)

(73) Assignee: ANI Acquisition Sub, LLC, Boca Raton, FL (US)

( * ) Notice: Subject to any disclaimer, the term of this patent is extended or adjusted under 35 U.S.C. 154(b) by 256 days.

(21) Appl. No.: 17/857,214

(22) Filed: Jul. 5, 2022

(65) Prior Publication Data

US 2024/0015931 A1     Jan. 11, 2024

(51) Int. Cl.
| | |
|---|---|
| *H05K 7/20* | (2006.01) |
| *F28F 3/06* | (2006.01) |
| *H04B 1/036* | (2006.01) |
| *H04B 1/38* | (2015.01) |

(52) U.S. Cl.
CPC ........... *H05K 7/20336* (2013.01); *F28F 3/06* (2013.01); *H04B 1/036* (2013.01); *H04B 1/38* (2013.01); *H05K 7/20309* (2013.01); *F28F 2275/025* (2013.01); *F28F 2275/04* (2013.01)

(58) Field of Classification Search
CPC .......... F28D 15/0275; F28D 2021/0029; F28F 2275/025; F28F 2275/04; F28F 3/06; F28F 3/14; H04B 1/036; H04B 1/38; H05K 7/20309; H05K 7/20336
See application file for complete search history.

(56) References Cited

U.S. PATENT DOCUMENTS

| | | | |
|---|---|---|---|
| 2016/0291652 A1 | 10/2016 | Rossi et al. | |
| 2020/0232710 A1* | 7/2020 | Lin | ..................... F28D 15/0275 |
| 2023/0175764 A1* | 6/2023 | Chauhan | ............... F25D 25/025 |
| | | | 62/3.6 |

FOREIGN PATENT DOCUMENTS

JP          07-183437 A       7/1995

OTHER PUBLICATIONS

E. M. Greitzer, Z. S. Spakovszky, I. A. Waitz, "18.2 Heat Transfer From a Fin", MIT Thermodynamics, Internet Archive: <https://web.archive.org/web/20220602120213/https://web.mit.edu/16.unified/www/FALL/thermodynamics/notes/node128.html>, Jun. 2, 2022, (Year: 2022).*

(Continued)

*Primary Examiner* — Nader Bolourchi
(74) *Attorney, Agent, or Firm* — Greenberg Traurig, LLP; Mammen ("Roy") P. Zachariah

(57) ABSTRACT

A heat exchanger includes a roll-bond evaporator having a heatpipe channel network spanning a primary panel area and at least one secondary multiple panel area, and at least one plurality of fins joined to at least one secondary panel area. The primary panel area is configured to receive electronic circuitry, heat transfer fluid is evaporated in heatpipe channels of the primary panel area, the heat transfer fluid is condensed in heatpipe channels in the secondary panel area(s), and heat is dissipated by the fins into an ambient environment. Secondary panel areas may be bent to bound a cavity and/or assume a generally cylindrical shape. The heat exchanger may be incorporated into a small cell radio node for 5G telecommunications.

20 Claims, 21 Drawing Sheets

(56) References Cited

OTHER PUBLICATIONS

Yousef, "12 Different Types of Heat Exchangers & Their Application", Mar. 7, 2023, online: <https://www.theengineerspost.com/types-of-heat-exchanger/> (Year: 2023).*

Heat Sink—Wikipedia, the free encyclopedia [retrieved Jul. 27, 2024], Retrived from Internet: <URL: http://en.wikipedia.org/wiki/Heat_sink> (Year: 2024).*

Heat exchanger—Wikipedia, the free encyclopedia [retrieved Jul. 27, 2024], Retrived from Internet: <URL: http://en.wikipedia.org/wiki/Heat_exchanger> (Year: 2024).*

Evaporator—Wikipedia, the free encyclopedia [retrieved Jul. 27, 2024], Retrived from Internet: <URL: http://en.wikipedia.org/wiki/Evaporator> (Year: 2024).*

Fin (extended_surface)—Wikipedia, the free encyclopedia [retrieved Jul. 27, 2024], Retrieved from Internet: <URL: http://en.wikipedia.org/wiki/Fin_(extended_surface)> (Year: 2024).*

George Meyer, "A Practical Guide for Using Liquid Two-Phase Heat Sinks" Celsia Thermail Live, 2015, online: <https://thermal.live/wp-content/uploads/2016/12/Celsia-Thermal-Live-Webinar.pdf> (Year: 2015).*

Khose, L. "Design and Development of Portable Vapour Compression Refrigerator," International Journal for Scientific Research & Development, vol. 6, Issue 7, pp. 288-293, 2018. online: <https://www.ijsrd.com/articles/IJSRDV6170098.pdf> (Year: 2018).*

Arts, et al; "QPACE 2 and Domain Decomposition on The Intel Xeon Phi"; Proceedings of Science, 2014, 16 Pages.

Gradinger, et al., "Assessment of Two-Phase Cooling of Power Electronics Using A Roll-Bonded Condensers", Journal of Thermal Science and Engineering Applications, vol. 7, Mar. 2015, pp. 011002-1-011002-8.

Liqiang Deng, et al., "Fabrication and thermal performance of a novel roll-bond flat thermosyphon", Applied Thermal Engineering, vol. 181, Aug. 2020, 15 pages.

Meyer, G., "Heat Pipes & Vapor Chambers Design Guidelines", Thermal Live 2016.

Rajkumar, et al., "Comparison Of Aluminum Roll Bond Evaporator With Geyser", Imperial Journal Of Interdisciplinary Research (IJIR), vol. 3, Issue 5, May 2017, pp. 841-848.

* cited by examiner

200

201 — PLATES INPUTTING

202 — WASHING

203 — BRUSHING

204 — PRINTING

205 — PLATES OVERLAPPING

206 — HEATING ⟶ HOT ROLLING ↓ COLD ROLLING

207 — ANNEALING

208 — INFLATING

209 — SHEARING / PRESSING

210 — WELDING (JOINT PIPE)

211 — LEAKAGE TESTING

212 — SURFACE TREATMENT

213 — BENDING PANEL AREA(S)

214 — JOINING FINS TO PANEL AREA(S)

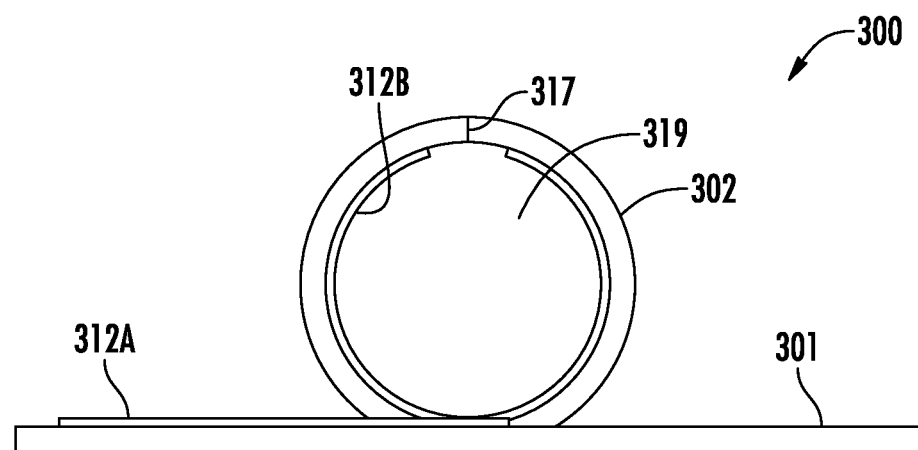
FIG. *13B*
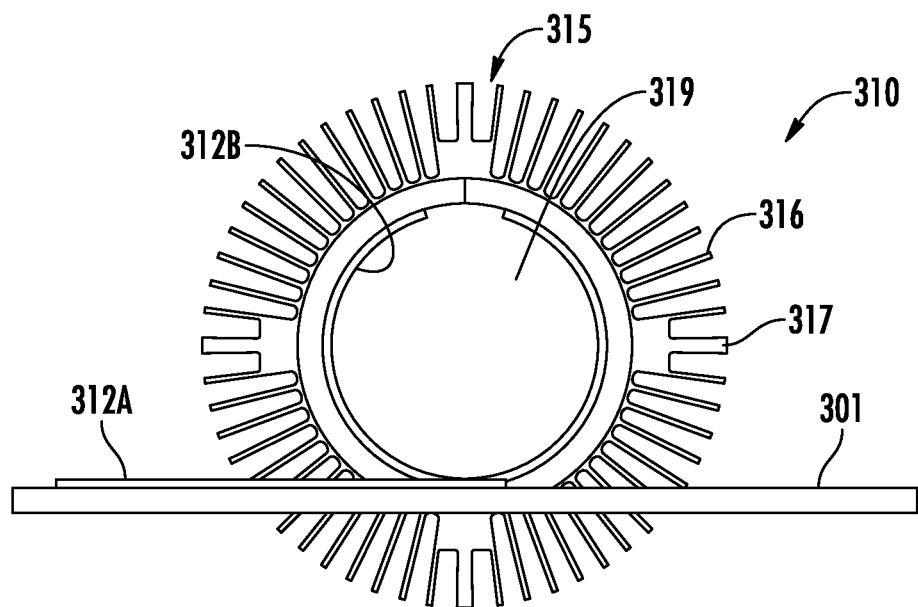
FIG. *13C*

HEAT EXCHANGER AND SMALL CELL RADIO NODE INCORPORATING THE SAME

BACKGROUND

The disclosure relates generally to thermal management for electronic circuitry, including heat exchangers suitable for dissipating thermal loads to a surrounding environment, and more specifically to heat exchangers suitable for use with a small cell radio nodes in a wireless communications system (WCS) (which can include a Fifth Generation (5G) system, a 5G New Radio (5G-NR) system, and/or a distributed communications system (DCS)), and associated fabrication methods.

Wireless communication is rapidly growing, with ever-increasing demands for high-speed mobile data communication. As an example, local area wireless services (e.g., so-called "wireless fidelity" or "WiFi" systems) and wide area wireless services are being deployed in many different types of areas (e.g., coffee shops, airports, libraries, etc.). Communications systems have been provided to transmit and/or distribute communications signals to wireless devices called "clients," "client devices," or "wireless client devices," which must reside within the wireless range or "cell coverage area" in order to communicate with an access point device. Example applications where communications systems can be used to provide or enhance coverage for wireless services include public safety, cellular telephony, wireless local access networks (LANs), location tracking, and medical telemetry inside buildings and over campuses. One approach to deploying a communications system involves the use of radio nodes/base stations that transmit communications signals distributed over physical communications medium remote units forming RF antenna coverage areas, also referred to as "antenna coverage areas." The remote units each contain or are configured to couple to one or more antennas configured to support the desired frequency (or frequencies) of the radio nodes to provide the antenna coverage areas. Antenna coverage areas can have a radius in a range from a few meters up to twenty meters, as an example. Another example of a communications system includes radio nodes, such as base stations, that form cell radio access networks, wherein the radio nodes are configured to transmit communications signals wirelessly directly to client devices without being distributed through intermediate remote units.

For example, FIG. 1 is an example of a WCS 100 that includes a radio node 102 configured to support one or more service providers 104(1)-104(N) as signal sources (also known as "carriers" or "service operators"—e.g., mobile network operators (MNOs)) and wireless client devices 106(1)-106(N). For example, the radio node 102 may be a base station (eNodeB) that includes modem functionality and is configured to distribute communications signal streams 108(1)-108(S) to the wireless client devices 106(1)-106(N). based on communications signals 110(1)-110(N) received from the service providers 104(1)-104(N). The communications signal streams 108(1)-108(S) of each respective service provider 104(1)-104(N) in their different spectrums are radiated through an antenna 112 to the wireless client devices 106(1)-106(N) in a communication range of the antenna 112. As another example, the radio node 102 in the WCS 100 in FIG. 1 can be a small cell radio access node ("small cell") that is configured to support the multiple service providers 104(1)-104(N) by distributing the communications signal streams 108(1)-108(S) for the multiple service providers 104(1)-104(N) based on respective communications signals 110(1)-110(N) received from a respective evolved packet core (EPC) network $CN_1$-$CN_N$ of the service providers 104(1)-104(N) through interface connections. The radio node 102 includes radio circuits 118(1)-118(N) for each service provider 104(1)-104(N) that are configured to create multiple simultaneous RF beams ("beams") 120(1)-120(N) for the communications signal streams 108(1)-108(S) to serve multiple wireless client devices 106(1)-106(N). For example, the multiple RF beams 120(1)-120(N) may support multiple-input, multiple-output (MIMO) communications.

The radio node 102 of the WCS 100 in FIG. 1 may be configured to support service providers 104(1)-104(N) that have a different frequency spectrum and do not share the spectrum. Thus, in this instance, the communications signals 110(1)-110(N) from the different service providers 104(1)-104(N) do not interfere with each other even if transmitted by the radio node 102 at the same time. The radio node 102 may also be configured as a shared spectrum communications system where the multiple service providers 104(1)-104(N) have a shared spectrum. In this regard, the capacity supported by the radio node 102 for the shared spectrum is split (i.e., shared) between the multiple service providers 104(1)-104(N) for providing services to the subscribers.

The radio node 102 in FIG. 1 can also be coupled to a distributed communications system (DCS), such as a distributed antenna system (DAS), such that the radio circuits 118(1)-118(N) remotely distribute the communications signals 110(1)-110(N) of the multiple service providers 104(1)-104(N) to remote units. The remote units can each include an antenna array that includes tens or even hundreds of antennas for concurrently radiating the communications signals 110(1)-110(N) to subscribers using spatial multiplexing, thereby taking advantage of the differences in RF channels between transmitting and receiving antennas to provide multiple independent streams between the transmitting and receiving antennas to increase throughput by sending data over parallel streams. Such remote units can be said to radiate the communications signals 110(1)-110(N) to subscribers based on a massive multiple-input multiple-output (M-MIMO) scheme.

The WCS 100 may be configured to operate as a Fifth Generation (5G) or a 5G New Radio (5G-NR) communications system. In this regard, the radio node 102 can function as a 5G or 5G-NR base station (a.k.a. gNB) to service the wireless client devices 106(1)-106(N), wherein the 5G or 5G-NR wireless communications system may be implemented based on a millimeter-wave (mmWave) spectrum.

Small cell radio nodes for 5G communications have steadily seen their power dissipation requirements increase from 45 watts to 65 watts, and rely on cooling by natural convection (i.e., avoiding forced convection by fans due to noise and reliability concerns). Conventionally, small cell radio nodes have utilized diecast heatsinks that provide both mechanical support and thermal dissipation. Evolving customer demands compel the need for small cell radio nodes to be comparatively small in size and low in weight, such as with a footprint of about 10" square (about 0.25 meter square) and a weight of no greater than about pounds (about 4.5 kg). The parameters of power dissipation and size present challenges because natural convection is dependent upon available surface area of the heat dissipating structure. In addition to power dissipation challenges, issues with hot spot reduction also exist, since various integrated circuits used in small cell radio nodes (e.g., processor and modem circuits) have operating temperature limits of 85° C. A conventional approach of simply providing larger and/or thicker heat dissipation fins is incapable of simultaneous addressing the foregoing considerations.

Need therefore exists in the art for heat exchangers for cooling electronics, including heat exchangers that can satisfy the unique combination of requirements of small cell radio nodes.

SUMMARY

Embodiments disclosed herein include a heat exchanger incorporating a roll-bond evaporator having a heatpipe channel network spanning a primary panel area and at least one secondary multiple panel area, and at least one plurality of fins joined to at least one secondary panel area. A heatpipe is a type of heat transfer device that employs phase transition of a heat transfer fluid to transfer heat between two interfaces, including an evaporator region in which the heat transfer fluid is evaporated (e.g., a hot side region that receives heat from a heat source), and a condenser region in which the heat transfer fluid is condensed (e.g., a cold side region that discharges heat to another structure or an environment). A heatpipe transports heat by the latent heat of vaporization of the heat transfer fluid, and permits heat to be transported more efficiently than relying on thermal conduction through a solid medium. A roll-bond evaporator includes two metallic sheets that are bonded together in a rolling mill, with embedded heatpipe channels formed in selected areas (e.g., where an anti-weld ink has been dispensed). The roll-bond evaporator provides efficient thermal transport while dispensing with the need for thick-base heatsink, permitting a heat exchanger of reduced size and weight to be provided. A heat-producing device such as electronic circuitry may be mounted to a primary panel area of the roll-bond evaporator, and lightweight fins (e.g., folded or stamped fins) may be attached to one or more secondary panel areas thereof to form a heat exchanger, which may also serve as a support chassis for the electronic circuitry. The heatpipe channel network extends between the primary and secondary panel areas to permit heat (e.g., generated by the electronic circuitry) to be transferred by the heatpipe channel network to the fins and dissipated into a surrounding environment. Associated device fabrication methods are also provided.

One exemplary embodiment of the disclosure relates to a heat exchanger. The heat exchange includes a roll-bond evaporator and at least one plurality of fins. The roll-bond evaporator includes first and second metallic sheets defining a primary panel area and at least one secondary panel area. A heatpipe channel network is arranged between the first and second metallic sheets, wherein the heatpipe channel network comprises first heatpipe channels arranged in the primary panel area and second heatpipe channels arranged in the at least one secondary panel area. The second heatpipe channels are in fluid communication with the first heatpipe channels. The at least one plurality of fins is joined to the at least one secondary panel area.

Another exemplary embodiment of the disclosure relates to a device fabrication method. The method includes defining a heatpipe channel network between first and second planar metallic sheets to produce a roll-bond evaporator, the heatpipe channel network comprising first heatpipe channels arranged in a primary panel area of the roll-bond evaporator, and comprising second heatpipe channels arranged in at least one secondary panel area of the roll-bond evaporator. The method further includes joining at least one plurality of finds to the at least one secondary panel area.

Additional features and advantages will be set forth in the detailed description which follows, and in part will be readily apparent to those skilled in the art from the description or recognized by practicing the embodiments as described in the written description and claims hereof, as well as the appended drawings.

It is to be understood that both the foregoing general description and the following detailed description are merely exemplary, and are intended to provide an overview or framework to understand the nature and character of the claims.

The accompanying drawings are included to provide a further understanding, and are incorporated in and constitute a part of this specification. The drawings illustrate one or more embodiment(s), and together with the description serve to explain principles and operation of the various embodiments.

BRIEF DESCRIPTION OF THE DRAWINGS

FIG. 13B is bottom plan view of the roll-bond evaporator of FIG. 13A, following bending of a secondary panel area into a substantially cylindrical configuration while the primary panel area remains in a flat configuration.

FIG. 13C is a bottom plan view of a heat exchanger incorporating the roll-bond evaporator of FIG. 13B following the joining of a plurality of fins to an outer surface of the cylindrical secondary panel area to cause the fins to project outwardly in a radial configuration.

DETAILED DESCRIPTION

Embodiments disclosed herein include a heat exchanger incorporating a roll-bond evaporator having a heatpipe channel network spanning a primary panel area and at least one secondary panel area, and at least one plurality of fins joined to at least one secondary panel area. One or more secondary panel areas may be non-coplanar with the primary panel area, such as by providing one or more bend areas between and/or in panel areas. A heat-producing device such as electronic circuitry may be mounted to the primary panel area, wherein the heatpipe channel network extends between the primary and secondary panel areas, to permit heat to be transferred to the fins and dissipated into a surrounding environment. Such a heat exchanger eliminates the need for a thick-base heatsink, may serve as a support chassis for electronic circuitry (such as a small cell radio node), and permits efficient heat dissipation in a relatively small, light-weight, and economical footprint suitable for use in cooling small cell radio nodes and similar devices.

As mentioned previously, a roll-bond evaporator includes two metallic (e.g., aluminum or aluminum alloy) sheets or layers that are bonded together in a rolling mill, with embedded heatpipe channels formed in selected areas previously treated with anti-weld ink. After inter-layer bonding is completed, channels between the metallic sheets may be expanded by injection of pressurized gas. Such expansion may occur in only one sheet (e.g., to provide semi-oval shaped or semi-circular shaped channels) or in both sheets (e.g., to provide oval or circular shaped channels), depending on parameters such as ductility and thickness of the respective metallic layers, and any constraints placed against one or more regions of the sheets during an expansion process.

Figure 1:
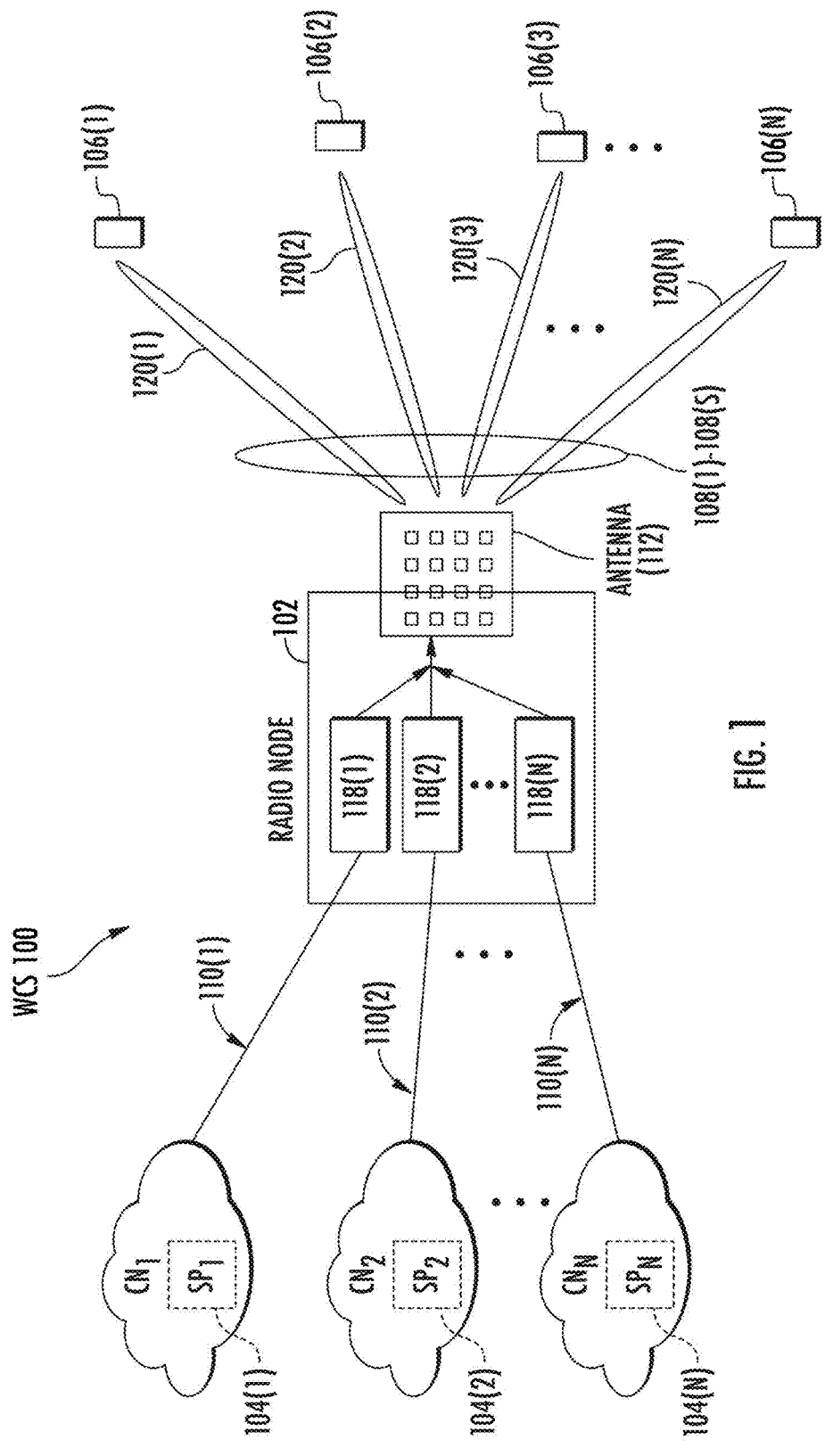
FIG. 1 is a schematic diagram of an exemplary communications system (CS), such as a distributed communications system (DCS), configured to distribute communications services to remote coverage areas.
Figure 2:
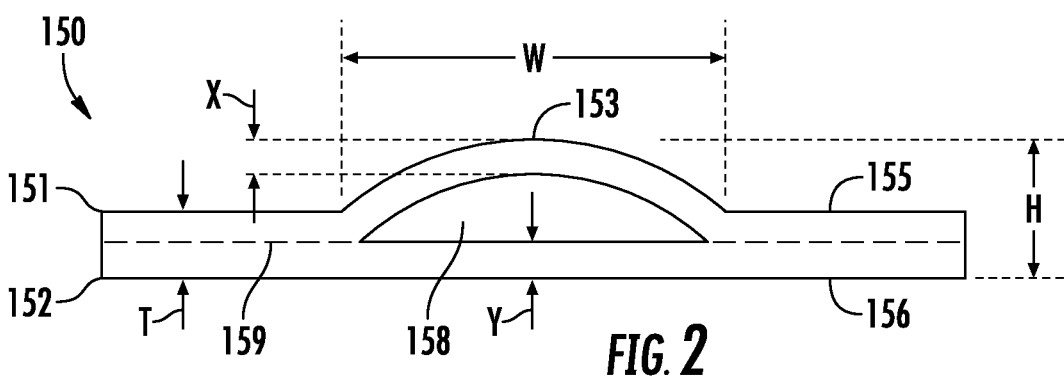
FIG. 2 is a cross-sectional view of a portion of a roll-bond evaporator including a heatpipe channel having a semi-oval shaped profile produced by single-sided channel expansion, and useful as part of a heat exchanger according to an embodiment of the disclosure.

FIG. 2 is a cross-sectional view of a portion of a first roll-bond evaporator 150 including a heatpipe channel 158 formed between a first metallic sheet 151 (having a thickness X) and a second metallic sheet 152 (having a thickness 1') and useful as part of a heat exchanger according to an embodiment of the disclosure. The heatpipe channel 158 (having a width W) is arranged along an interface 159 between the bonded metallic sheets 151, 152, and has a semi-oval shaped profile produced by expansion of the first metallic sheet 151 (i.e., single-sided channel expansion) at an expansion region 153. The resulting roll-bond evaporator 150 is non-uniform in thickness, having a nominal thickness T in regions devoid of heatpipe channels, having an increased thickness H in regions where heatpipe channels 158 are present, wherein a first outer surface 155 is not uniformly flat, while a second outer surface 156 is generally flat in character.

Figure 3:
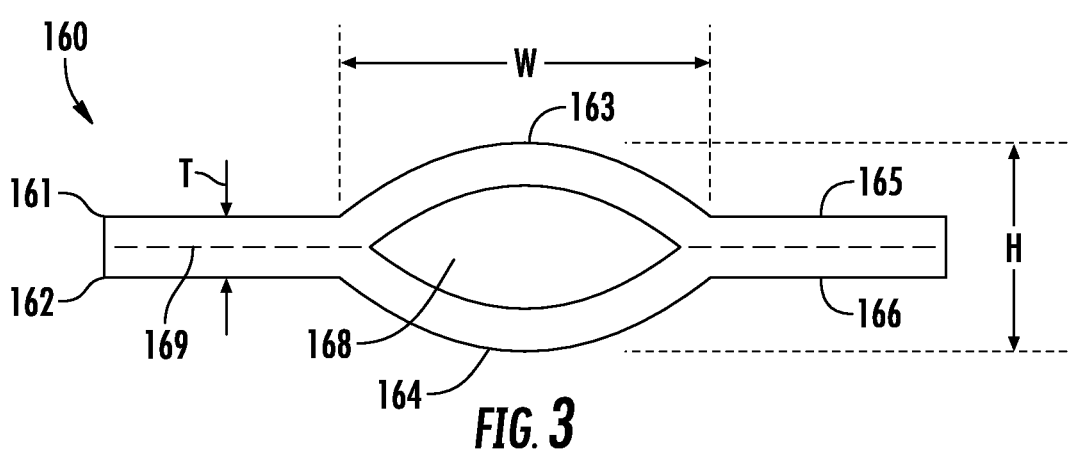
FIG. 3 is a cross-sectional view of a portion of a roll-bond evaporator including a heatpipe channel having an oval shaped profile produced by double-sided channel expansion, and useful as part of a heat exchanger according to an embodiment of the disclosure.

FIG. 3 is a cross-sectional view of a portion of a second roll-bond evaporator 160 including a heatpipe channel 168 formed between a first metallic sheet 161 (having a thickness X) and a second metallic sheet 162 (having a thickness 1') and useful as part of a heat exchanger according to an embodiment of the disclosure. The heatpipe channel 168 (having a width W) is arranged along an interface 169 between the bonded metallic sheets 161, 162, and has a generally oval shaped profile produced by expansion of the first and second metallic sheets 161, 162 (i.e., double-sided channel expansion) at expansion regions 163, 164. The resulting roll-bond evaporator 160 has a nominal thickness Tin regions devoid of heatpipe channels, and has an increased thickness H in regions where heatpipe channels 168 are present, wherein the first and second outer surfaces 165, 166 are not uniformly flat in character.

Figure 4:
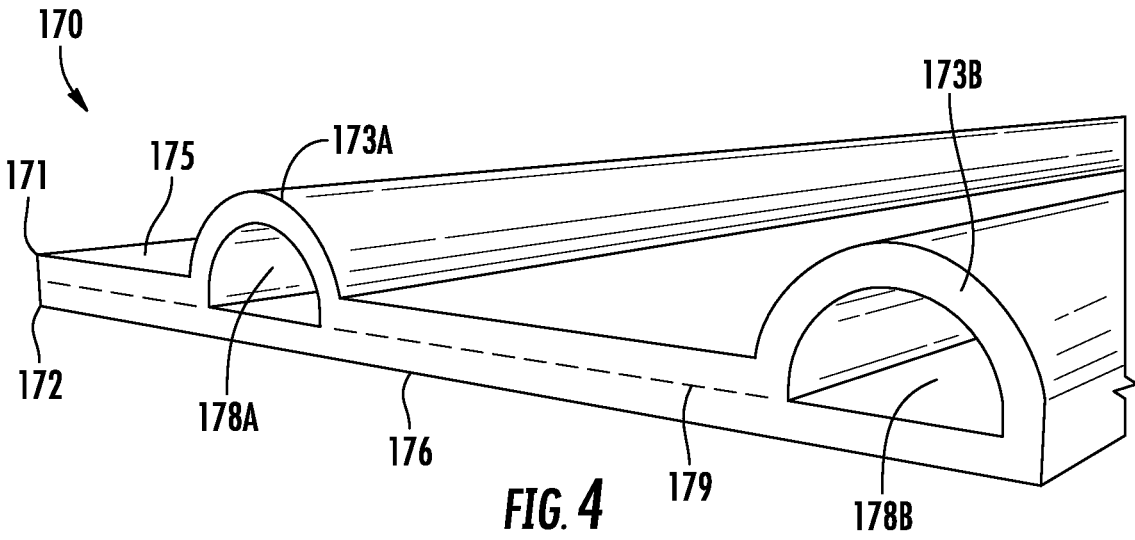
FIG. 4 is a cross-sectional view of a portion of a roll-bond evaporator including heatpipe channels each having a semi-circular shaped profile.

FIG. 4 is a cross-sectional view of a portion of a second roll-bond evaporator 170 including heatpipe channels 178A, 178B formed between first and second metallic sheets 171, 172 and useful as part of a heat exchanger according to an embodiment of the disclosure. The heatpipe channels 178A, 178B are arranged along an interface 179 between the bonded metallic sheets 171, 172, and have a generally semi-circular shaped profile produced by expansion of the first metallic sheet 171 (i.e., single-sided channel expansion) at expansion regions 173A, 173B. The resulting roll-bond evaporator 170 has a first outer surface 175 that is not uniformly flat in character, while an opposing second outer surface 176 is generally flat.

Figure 5:
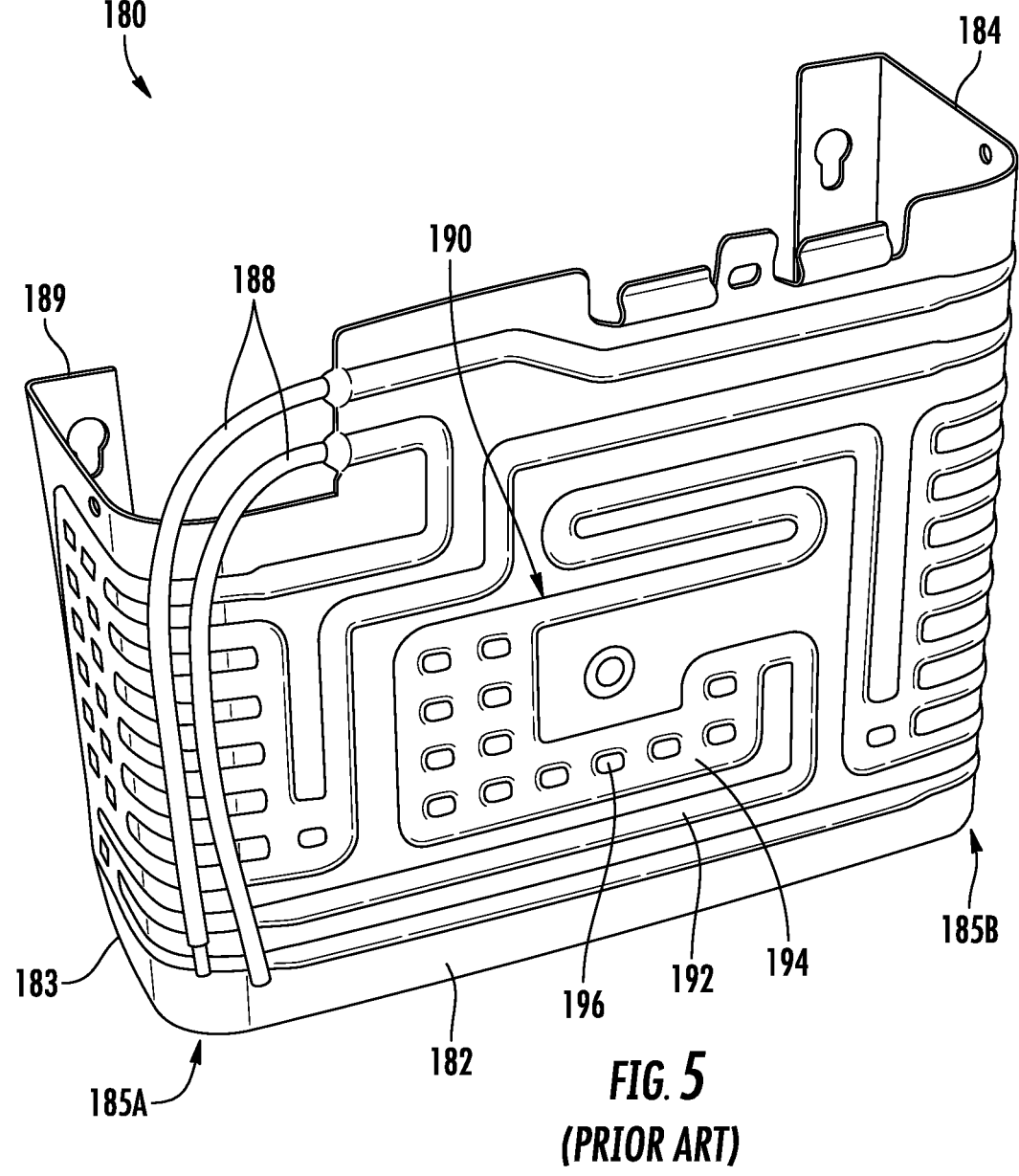
FIG. 5 is a perspective view of a portion of a conventional roll-bond evaporator including a heatpipe channel network extending around three panels thereof to form a flattened U-shaped configuration.

FIG. 5 is a perspective view of a portion of a conventional roll-bond evaporator 180 (e.g., useable in compact refrigerators) including a heatpipe channel network 190 extending around three panel areas thereof (i.e., panel areas 182-184) to form a flattened U-shaped configuration. Bend areas 185A, 185B are provided between adjacent panel areas 182-184 to cause two end panel areas 183, 184 to be substantially perpendicular to a center panel area 182. Mounting bracket areas 189 are provided along edges of the end panel areas 182-183. The heatpipe channel network 190 includes narrow channel regions 192 and wide channel regions 194, wherein the wide channel regions 194 include intermediate bonded areas 196 that are recessed relative to the wide channel regions 194 to provide structural support to the wide channel regions 194 and prevent delamination thereof during expansion (e.g., by pressurized inflation) of the wide channel regions 194. Tubes 188 may be coupled with the heatpipe channel network 190, and may be sealed closed after additional of a working fluid to the heatpipe channel network 190.

Figure 6:
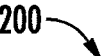
FIG. 6 is a flowchart identifying steps in a method for fabricating a heat exchanger according to an embodiment of the disclosure.
Figure 6:
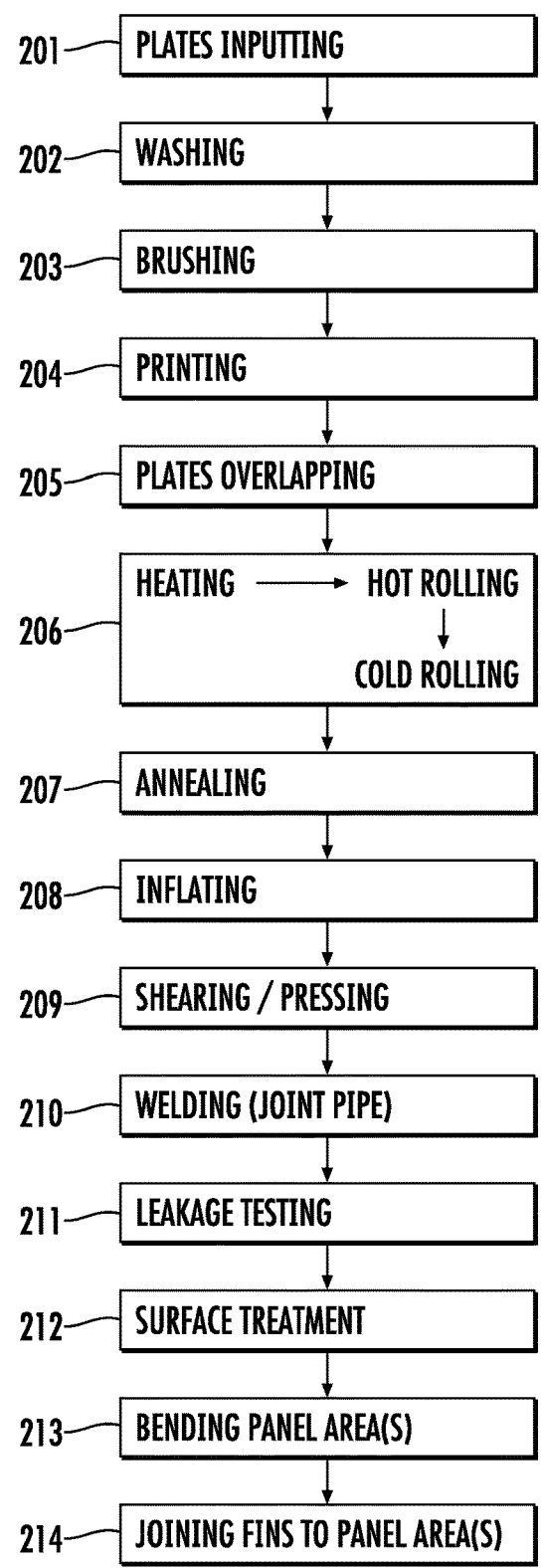

FIG. 6 is a flowchart identifying steps of a method 200 for fabricating a heat exchanger according to an embodiment of the disclosure. A first step 201 includes inputting metallic plates or sheets to a production facility. Suitable metallic plates or sheets (hereinafter "sheets") may include aluminum, aluminum alloy, copper alloy, or another suitably thermally conductive, light, and corrosion-resistant metal or alloy thereof. Second and third steps 202, 203 include washing and brushing the metallic sheets to remove any oils, particles, and/or surface contaminants, and to impart a dull surface finish, to prepare them for a printing process. A fourth step 204 includes printing (or otherwise applying) anti-weld ink to a surface of one or more of the metallic sheets to locally inhibit bonding when two sheets are subjected to a rolling process. The printing may involve screen printing or any other suitable printing process. After printing, the sheets may be dried in an oven to ensure the printed ink is dried and/or cured. Thereafter, a fifth step 205 involves overlapping the sheets, and two dried sheets (with a printed ink design arranged therebetween) may optionally be crimped together along at least one edge to hold them together in preparation for a rolling process. A sixth step 206 includes heating the overlapped sheets in a furnace to facilitate inter-sheet bonding, then supplying the sheets to a hot rolling apparatus followed by a cold rolling apparatus, wherein the combination of heat and pressure serves to bond the sheets together. The foregoing rolling processes may involve reducing a combined thickness while increasing an aggregate length of the bonded sheets. After cooling, a seventh step 207 includes annealing the bonded sheets by subjecting them to elevated temperature for an extended duration (e.g., an hour or more) in an annealing chamber, followed by a cooling. Annealing may be performed to relieve stresses due to work hardening and therefore prevent cracks in the sheets when heatpipe channels (corresponding to unbonded areas between the sheets) are expanded. Any eighth step 208 includes inflating (i.e., expanding) channels between the sheets by supplying pressurized gas (e.g., compressed air) to areas previously printed with anti-weld ink, thereby causing localized expansion of the sheets (either by single-sided channel expansion or double-sided channel expansion). A ninth step 209 includes shearing and/or pressing the bonded sheets (with a heatpipe channel network defined therein) in desired areas to produce a substantially flat channel-defining evaporator body of a suitable shape and dimensions. A tenth step 210 includes welding or brazing a joint pipe (e.g., copper tubing) to an edge of the evaporator body to provide fluid communication with the heatpipe channels, followed by supplying of a heat transfer fluid (e.g., water, refrigerant, alcohol, ethylene glycol, mixtures of the foregoing, or other suitable liquid(s)) through the joint pipe to the heatpipe channel network, after which the joint pipe may be capped, crimped, and/or welded shut. An eleventh step 211 includes leakage testing of the heatpipe channel network to ensure the absence of any leaks. A twelfth step 212 includes treating outer surfaces of the evaporator body to prevent corrosion, such as by applying a suitable paint or other coating. A thirteenth step 213 includes forming one or more bend areas in the evaporator body, such as to provide bends between different panel areas of the evaporator body and/or bends or curves within individual panel areas. Since the heatpipe channel network may be provided in multiple panel areas (e.g., a primary panel area and at least one secondary panel area), care should be taken to avoid small bend radii that would unduly restrict or prevent fluid flow between heatpipe channels of respective panel areas.

With continued reference to FIG. 6, a fourteenth step 214 includes joining groups of fins to one or more secondary panel areas to aid in dissipating heat from those panel areas. Various types of fin groups may be used, such as may be produced by extrusion, bonding, skiving, stamping, casting, and folding; however, dimensional (e.g., width) and weight limits render extruded and cast fin structures undesirable. Stamped heat sinks are typically made in a specific shape. but are generally used for low power applications. Skived heat sinks provide desirably fin thicknesses and densities, but drawbacks include increased weight and high initial costs. Bonded fins may be desirably used, as thin fins could be directly attached to secondary panel areas of a roll-bond evaporator, but may entail high cost. Folded fins can be made thin and economical, and offer a good surface for attachment to a roll-bond evaporator by brazing. Among various types of fins that may be used, fin attachment options include soldering, thermal epoxy, and/or brazing (e.g., controlled atmosphere brazing (CAB), vacuum brazing, and dip brazing) in certain embodiments. In certain embodiments, each fin used with a heatsink disclosed herein may have a thickness of no greater than 3 mm, no greater than 2 mm, or no greater than 1 mm, or no greater than 0.75 mm, or no greater than 0.5 mm, or having a dimensional range between any pair of the foregoing values as endpoints. In certain embodiments, a plurality of fins is configured (e.g., based on surface area, material properties, surface finish, etc.) to dissipate at least 5 watts, at least 10 watts, at least 25 watts, at least 35 watts, at least 45 watts, at least 55 watts, at least 65 watts (or power in a range of 5-100 watts, 25-100 watts, 45-100 watts, 65-100 watts, 65-150 watts, or 75-150 watts) into an ambient air environment in which the heat exchanger is located, without permitting electronic circuitry coupled with a heat exchanger (incorporating the fins) to experience a temperature above 85° C. (or above 75° C.).

In certain embodiments, steps of supplying of heat transfer fluid to a heatpipe channel network, leakage testing 211, and/or surface treatment 212, may be performed after the bending step 213 and the fin joining step 214.

FIGS. 7A-7I schematically illustrate apparatuses that may be used in performing steps, and/or intermediate products generated upon performing steps, as described in connection with FIG. 6.

Figure 7A:
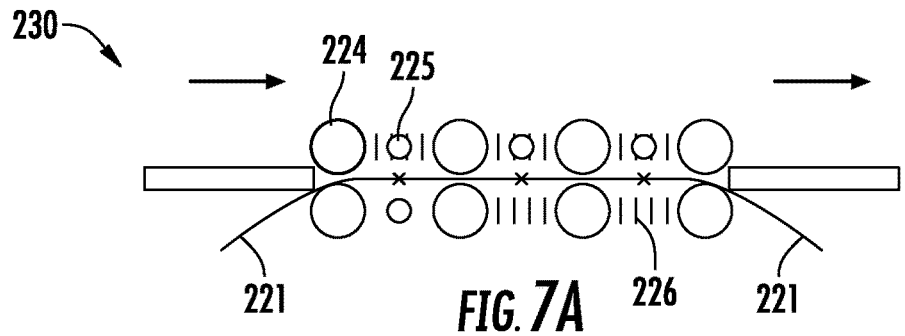
FIG. 7A is a schematic diagram showing a metallic sheet washing and brushing station that may be used to perform washing and brushing steps described in connection with FIG. 6.

FIG. 7A is a schematic diagram showing a metallic sheet washing and brushing station 220 that may be used to perform steps of washing 202 and brushing 203 as described in connection with FIG. 6. A metallic sheet 221 may be supplied between rollers 224 and transported between cleaning heads 225 and brushing heads 226 to remove any oils, particles, and/or surface contaminants from metallic sheets, and to impart a dull surface finish, to prepare the metallic sheets for a printing process.

Figure 7B:
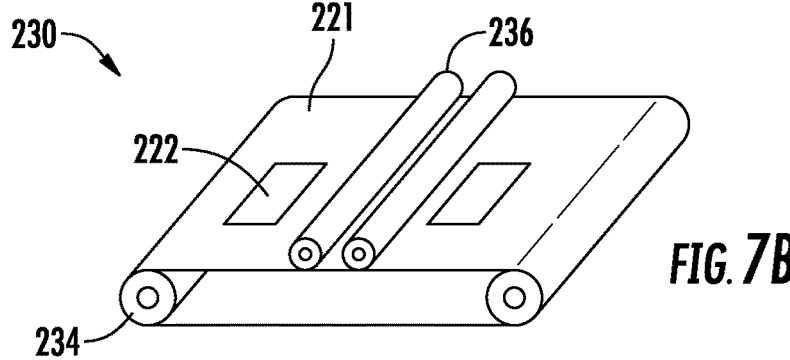
FIG. 7B is a schematic diagram showing a surface printing station that may be used to perform a printing step described in connection with FIG. 6.
Figure 7C:
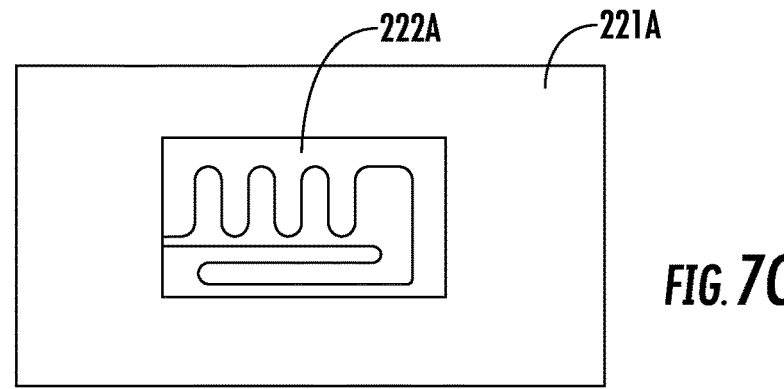
FIG. 7C is a schematic diagram showing a metallic sheet containing a patterned area of anti-weld ink applied thereon as described in connection with FIG. 6.

FIG. 7B is a schematic diagram showing a surface printing station 230 that may be used to perform a step of printing anti-weld ink 204 to surfaces of metallic sheets as described in connection with FIG. 6. Rollers 234 may be used to convey a metallic sheet 221 past screen printing rollers 236 (or print heads) to apply anti-weld ink in desired areas 222 of the metallic sheet 221. FIG. 7C is a schematic diagram showing a metallic sheet 221A containing a patterned area 222A of anti-weld ink applied thereon using the surface printing station 230 of FIG. 7B.

Figure 7D:
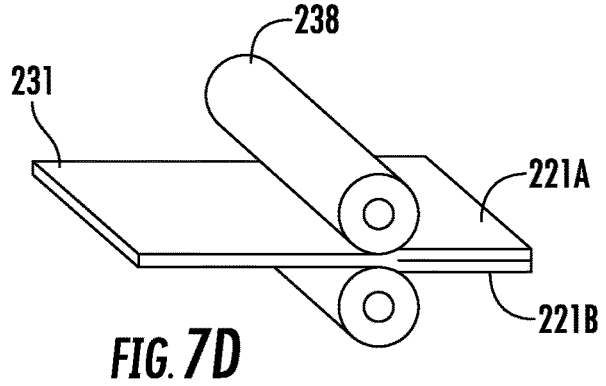
FIG. 7D is a schematic diagram showing a rolling station that may be used to perform one or more rolling steps described in connection with FIG. 6.

FIG. 7D is a schematic diagram showing a rolling station including rollers 238 that may be used to perform one or more rolling steps described in connection with FIG. 6. As noted previously, sheets 221A-221B may be heated and then passed through the rollers 238 as part of a hot rolling step, followed by cooling and cold rolling, according to step 206 described in FIG. 6.

Figure 7E:
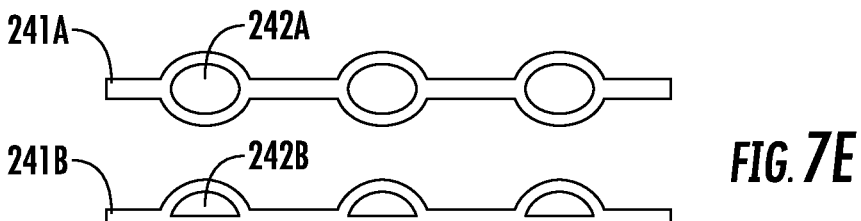
FIG. 7E shows portions of alternative first and second roll-bond evaporators, the portion of the first roll-bond evaporator including heatpipe channels each having an oval shaped profile, and the portion of the second roll-bond evaporator including heatpipe channels each having a semi-oval shaped profile, with the heatpipe channels of both roll-bond evaporators produced by an inflating step as described in connection with FIG. 6.

FIG. 7E shows portions of alternative first and second roll-bond evaporators 241A, 241B, the portion of the first roll-bond evaporator 241A including heatpipe channels 242A each having an oval shaped profile, and the portion of the second roll-bond evaporator 241B including heatpipe channels 242B each having a semi-oval shaped profile, wherein the heatpipe channels 242A, 242B may be expanded by an inflating step 208 as described in connection with FIG. 6.

Figure 7F:
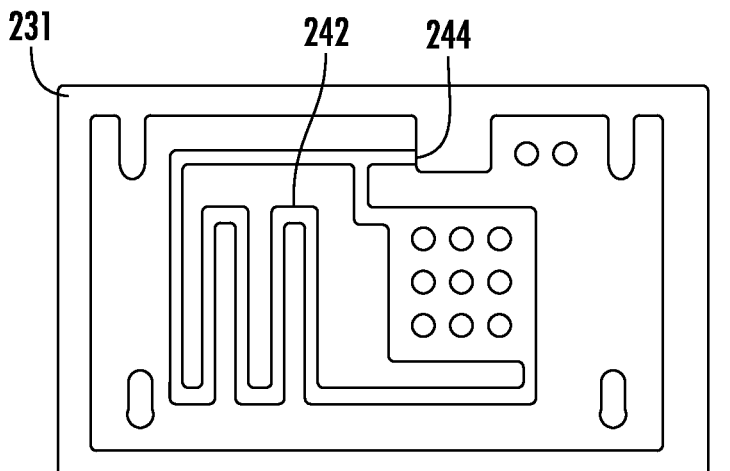
FIG. 7F is a plan view of a roll-bond evaporator in flat form following performance of a shearing and/or pressing step as described in connection with FIG. 6.

FIG. 7F is a plan view of a roll-bond evaporator 231 in flat form, including a heatpipe channel network 242 and a channel terminus 244, following performance of a shearing and/or pressing step 209 as described in connection with FIG. 6.

Figure 7G:
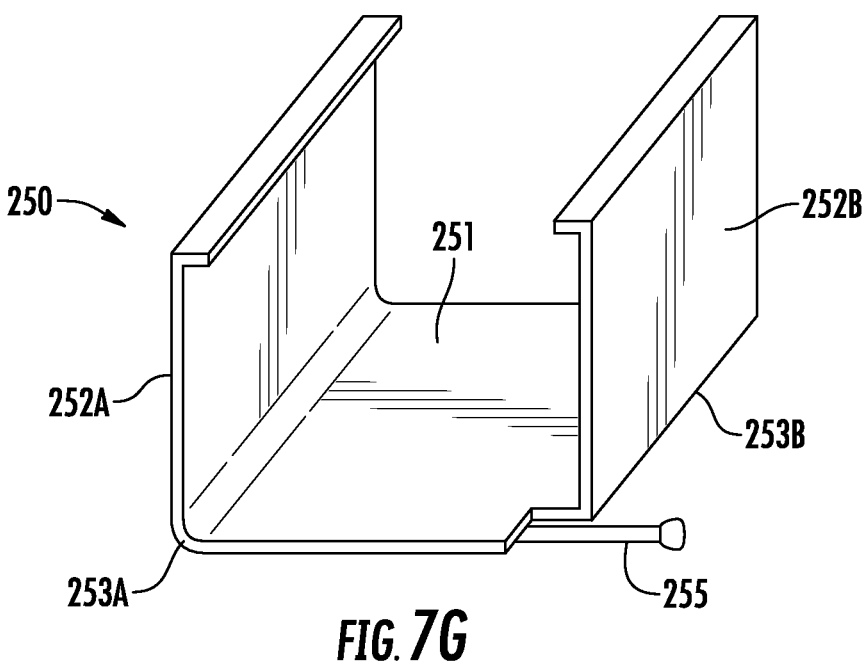
FIG. 7G is a perspective view of the roll-bond evaporator following performance of a joint pipe welding step, a leakage testing step, and a bending step as described in connection with FIG. 6, to provide a primary panel area and two secondary panel areas that are non-coplanar with the primary panel area.

FIG. 7G is a perspective view of a roll-bond evaporator 250 (produced from a flat form evaporator according to FIG. 7F, but omitting illustration of the heatpipe channel network

242 for simplicity) following attachment of a joint pipe 255, following formation of multiple bend areas 253A, 253B to segregate the roll-bond evaporator into a primary panel area 251 and secondary panel areas 252A, 252B that are substantially perpendicular to the primary panel area 251. The joint pipe 255 may be used to supply heat transfer fluid to a heatpipe channel network defined in the primary panel area 251 and secondary panel areas 252A, 252B.

Figure 7H:
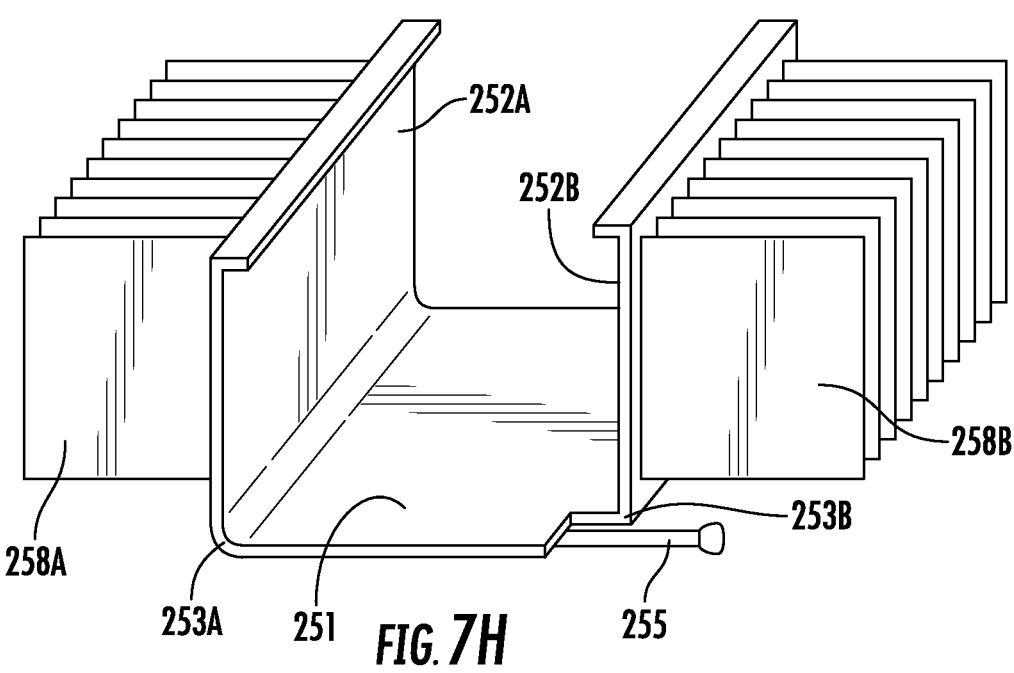
FIG. 7H is a perspective view of the roll-bond evaporator following joining of two pluralities of fins to the two secondary panel areas as described in connection with FIG. 6 to form a heat exchanger according to an embodiment of the disclosure.

FIG. 7H is a perspective view of the roll-bond evaporator of FIG. 7G following the joining of a first plurality of fins 258A to one secondary panel area 252A, and joining of a second plurality of fins 258B to another secondary panel area 252B. As shown, the fins 258A-258B are flat and generally plate-like in configuration, and extend in a vertical direction to enable circulation of air by natural convection. When electronic circuitry (not shown) is mounted to the primary panel area 251, heat generated by the circuitry is conveyed from a heatpipe channel network therein to the secondary panel areas 252A, 252B and then conducted to the fins 258A, 258B to be dissipated into an ambient environment. Heat exchange fluid, which may be supplied to the channel network through a joint pipe 255, may be evaporated in heatpipe channels arranged in the primary panel area 251 and condensed in heatpipe channels in the secondary panel areas 252A, 252B. In such an instance, it may be advantageous to elevate the secondary panel areas 252A, 252B relative to the provide the primary panel area 251, to permit condensed heat exchange fluid to be naturally returned to the primary panel area 251 by the force of gravity. In certain embodiments, one or more electrically operated fans (not shown) may be provided to supply a flow of forced air over a plurality of fins, in order to promote forced convective heat transfer and thereby facilitate heat dissipation into a surrounding environment, regardless of whether fins are provided in a vertical or horizontal configuration. In certain embodiments, one or more temperature sensors may be provided to monitor temperatures of the electronic circuitry, portions of the heat exchanger, and/or an ambient environment, and the one or more fans may be operated responsive to signals received from the one or more temperature sensors, such that fans may be operated only when and/or to the extent they are needed to maintain component temperatures in a desired range.

The terms "heatpipe channel" and "heatpipe channel network" as used herein in the context of a roll-bond evaporator are intended to encompass any fluid-containing channel structures formed between roll-bonded sheets, regardless of whether any capillary structure (e.g., sintered particles, mesh structure, grooves, etc.) is provided within the channel structures. In this regard, the terms "heatpipe channel" and "heatpipe channel network" are intended to encompass both traditionally capillary heatpipe structures and non-capillary heatpipe (also called thermosyphon) structures. In certain embodiments, a capillary structure could be provided by delivering a particle coating inside a channel network, optionally being smoothed by a radial bristle brush, followed by sintering (i.e., heating to bond particles to channel surfaces). Another method for producing a capillary structure involves flowing a coating fluid through channels, followed by sintering. Regardless of whether a heatpipe channel network includes any capillary structure, in certain embodiments, such a channel network may include heatpipe channels in secondary panel areas that, in use, are elevated relative to heatpipe channels in a primary panel area to permit gravity to assist in returning condensate from heatpipe channels in the secondary panel areas to the heatpipe channels in the primary panel area.

As noted previously, care should be taken to avoid flow restrictions between heatpipe channels in adjacent panel areas when one or more bend areas is provided therebetween. In certain embodiments, flow restrictions may be reduced or avoided by avoiding small bend radii between panel areas. In certain embodiments, flow restrictions may be reduced or avoided by providing an inter-panel conduit that is external to the metallic sheets of a roll-bond evaporator.

Figure 8:
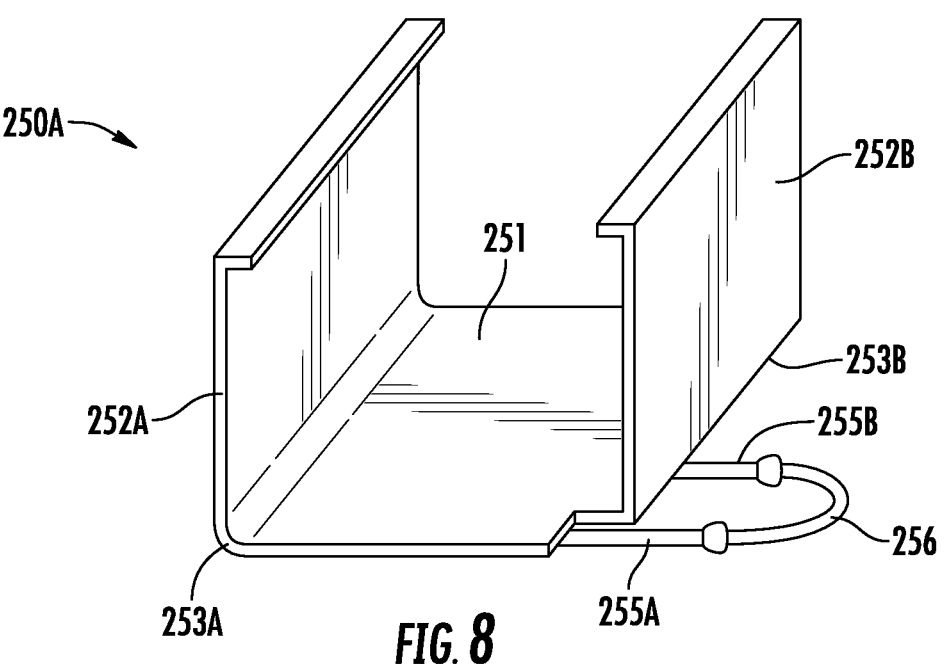
FIG. 8 is a perspective view of a roll-bond evaporator in bent form, prior to joining of fins, showing a first joint pipe welded to a primary panel area and a second joint pipe welded to a secondary panel area, with a conduit joining the first and second joint pipes arranged external to the metallic sheets of the roll-bond evaporator.

FIG. 8 is a perspective view of a roll-bond evaporator 250A according to an embodiment substantially similar to the roll-bond evaporator 250 of FIG. 7G, showing a first joint pipe 255A welded to a primary panel area 251, and a second joint pipe 255B welded to a secondary panel area 252B (which opposes another secondary panel area 252A also joined to the primary panel area 251). A conduit 256 (e.g., of copper tubing or another suitable metal) is coupled to the first and second joint pipes 255A, 255B and arranged external to the metallic sheets of the roll-bond evaporator 250A, thereby bypassing any restriction that might otherwise be formed by heatpipe channels (not shown) extending past the bend area 253B between the primary panel area 251 and the second panel area 252B. Although the roll-bond evaporator 250A is shown without fins, it is to be appreciated that fins 258A, 258B as shown in FIG. 711 may be joined to the secondary panel areas 252A, 252B to form a heat exchanger.

In certain embodiments, a roll-bond evaporator may include secondary panel areas bent to form a cavity, with fins joined to secondary panel areas, and with secondary panel areas being elevated relative to a primary panel area to which electronic circuitry may be mounted.

Figure 9:
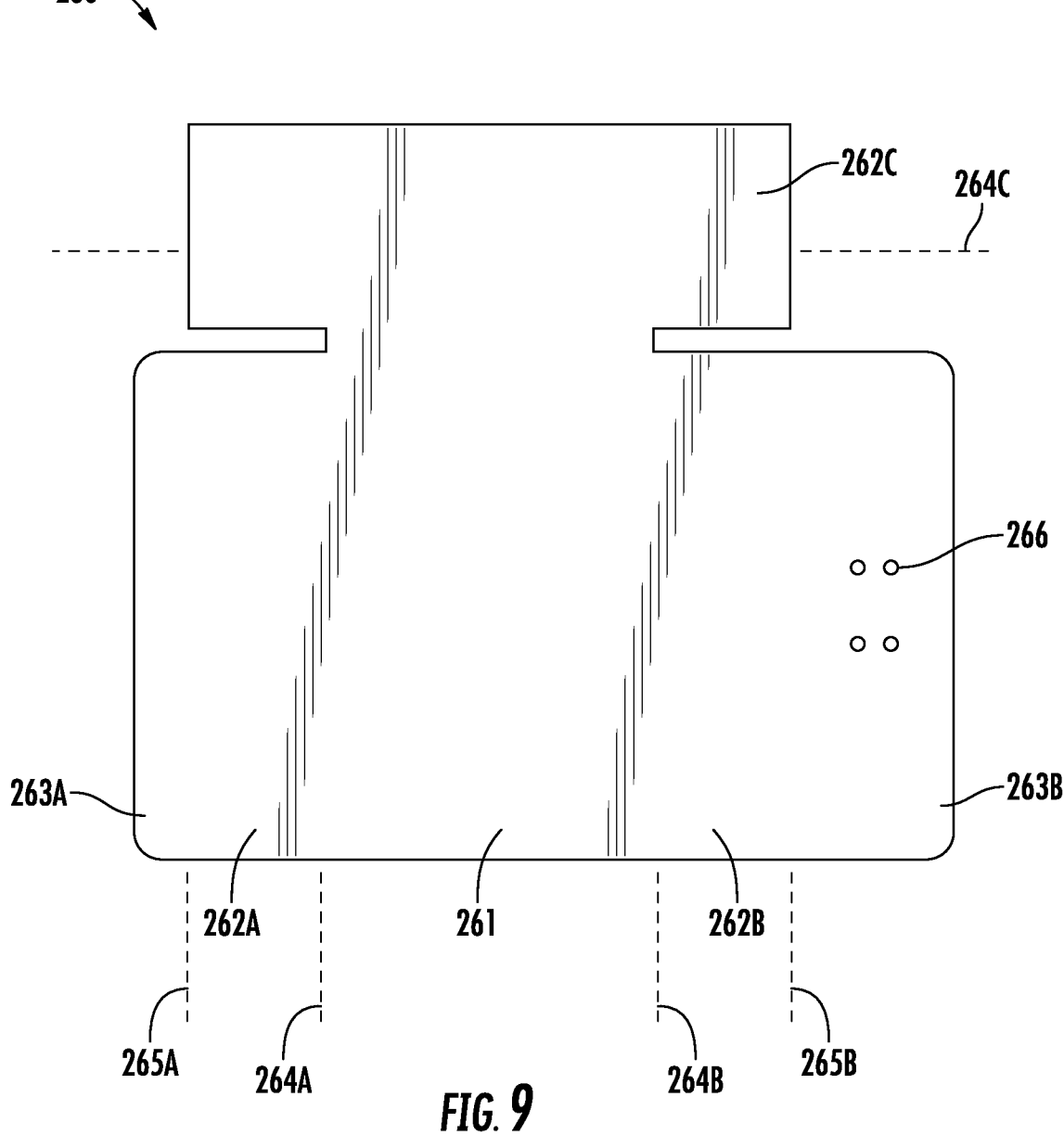
FIG. 9 is a bottom plan view of a roll-bond evaporator in flat form prior to formation of bend areas between panel areas thereof, with superimposed dashed lines corresponding to bend areas to be formed by a bending step.

FIG. 9 is a bottom plan view of a roll-bond evaporator 260 in flat form prior to formation of bend areas between panel areas thereof, with superimposed dashed lines 264A-264C, 265A-265B corresponding to bend areas to be formed by a bending step. It is to be understood that the roll-bond evaporator 260 includes a heatpipe channel network (not shown) including heatpipe channels in each of a primary panel area 261 and multiple secondary panel areas 262A-262C. Extension panel areas 263A-263B that may be devoid of heatpipe channels and extend from selected secondary panel areas 262A-262B are also provided, with one extension panel area 263B including mounting holes 266 therein. The secondary panel areas 262A-262C are each configured to receive multiple fins, as shown in the ensuing figures.

Figure 10A:
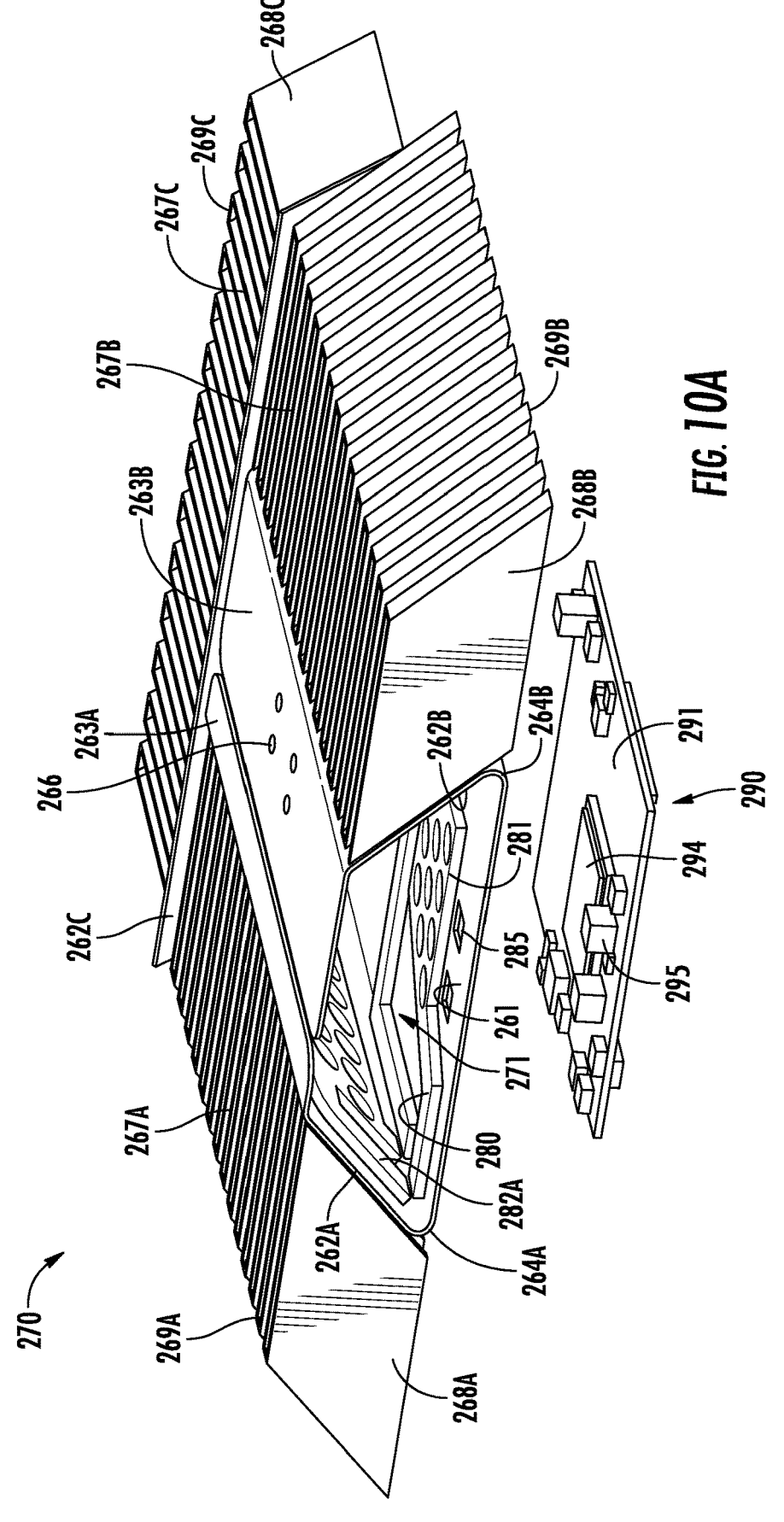
FIG. 10A is a perspective view of a heat exchanger according to one embodiment produced by bending the roll-bond evaporator of FIG. 9 to form first to third secondary panel areas laterally bounding a cavity along three sides, and by joining pluralities of fins to the secondary panel areas, with such figure further showing electronic circuitry arranged proximate to the heat exchanger.

FIG. 10A is a perspective view of a heat exchanger 270 according to one embodiment, together with electronic circuitry 290 arranged proximate to a primary panel area 261 of the heat exchanger 270. The heat exchanger 270 is produced by bending the roll-bond evaporator of FIG. 9 (e.g., at bend areas 264A-264C) to cause the three secondary panel areas 262A-262C to laterally bound a cavity 271 along three sides, the cavity 271 being bounded from below by the primary panel area 261, and bounded from above by extension panel areas 263A-263B. The heat exchanger 270 is also produced by joining pluralities of fins 268A-268C to the secondary panel areas 262A-262C. Each plurality of fins 268A-268C comprises folded fins in which fin sections 267A-267C are joined by multiple folds 269A-269C, with fin faces extending in a vertical direction and parallel gaps between adjacent fins to permit passage of air by natural convection. The pluralities of fins 268A-268C may be joined to the secondary panel areas 262A-262C by any suitable technique such as brazing, soldering, thermal epoxy, thermal bonding, etc. As shown, a heatpipe channel network 280 is provided, including heatpipe channels 281 in the primary panel area 261, and additional heatpipe channels (e.g., 282A as shown) on the secondary panel areas 262A-262C. The primary panel area 261 includes cutouts 285 configured to receive tall or elevated components 295 (or other raised structures) associated with the electronic circuitry 290, with the electronic circuitry 290 further including a circuit board 291 and one or more processors 294. In certain embodiments, the electronic circuitry 290 comprises radio circuitry configured to distribute wireless communication signal streams to multiple wireless client devices. Mounting holes 266 defined in the extension panel area 263B atop the heat exchanger 270 may be used to mount the heat exchanger 270 to any suitable structure. Although only a single circuit board 291 is shown, it is to be appreciated that multiple circuit boards may be provided, such as with multiple circuit boards arranged along one face of the primary panel area 261 (e.g., in a side-by-side configuration or a stacked configuration such as with suitable standoffs to separate a secondary circuit board from a primary circuit board), or with multiple circuit boards provided along opposing faces of primary panel area 261. In certain embodiments, circuit boards may be arranged between the primary panel area 261 and one or more covers (not shown), optionally in combination with suitable gaskets or seals to provide environmental protection and guard against instruction of moisture, particulate material, or other contaminants.

In certain embodiments, a thermal interface material may be arranged (e.g., sandwiched or otherwise compressed) between the electronic circuitry 290 and the primary panel area 261 to facilitate conduction (or conduction plus spreading) of heat between the electronic circuitry 290 and the primary panel area 261 of the roll-bond evaporator 270. In certain embodiments, such a thermal interface material may include a bonded metal plate arranged between the electronic circuitry 290 and the primary panel area 261, which may be affixed by any suitable means including brazing, soldering, thermally conductive adhesive, and the like. In certain embodiments, a thermal interface material may be affixed or otherwise applied to the primary panel area 261 after the roll-bond evaporator 270 is formed. If desired, a thermal interface material may protrude in a direction toward the electronic circuitry 290.

Figure 10B:
FIG. 10B is a perspective view of the heat exchanger of FIG. 10A, following mounting of the electronic circuitry to a primary panel area of the roll-bond evaporator along a face thereof arranged below the cavity.

FIG. 10B is a perspective view of the heat exchanger 270 of FIG. 10A, following mounting of the electronic circuitry 290 thereto to form a small cell radio node 299. The electronic circuitry 290 is mounted to the primary panel area 261 of the roll-bond evaporator 270 along a face thereof arranged below the cavity 271, with tall or elevated components 295 being visible as projecting through the cutouts (285 in FIG. 10A) of the primary panel area. In use of the heat exchanger 270, heat generated by the electronic circuitry 290 is conducted into heat exchange fluid in heatpipe channels 281 in the primary panel area 261, such fluid is evaporated and conveyed through the heatpipe channel network 280 to heatpipe channels in the secondary panel areas 262A-262C where the fluid is condensed, and heat is conducted into the pluralities of fins 268A-268C where it is dissipated into an ambient air environment. A protective cover (not shown) may be arranged to cover and prevent exposure of the electronic circuitry, wherein a gasket or seal may be provided between the protective cover and the primary panel area to provide weather protection and prevent intrusion of unwanted moisture, particulates, and/or other contaminants. The remaining elements of FIG. 10B are the same as described in connection with FIG. 10A, and will not be described again.

Figure 11:
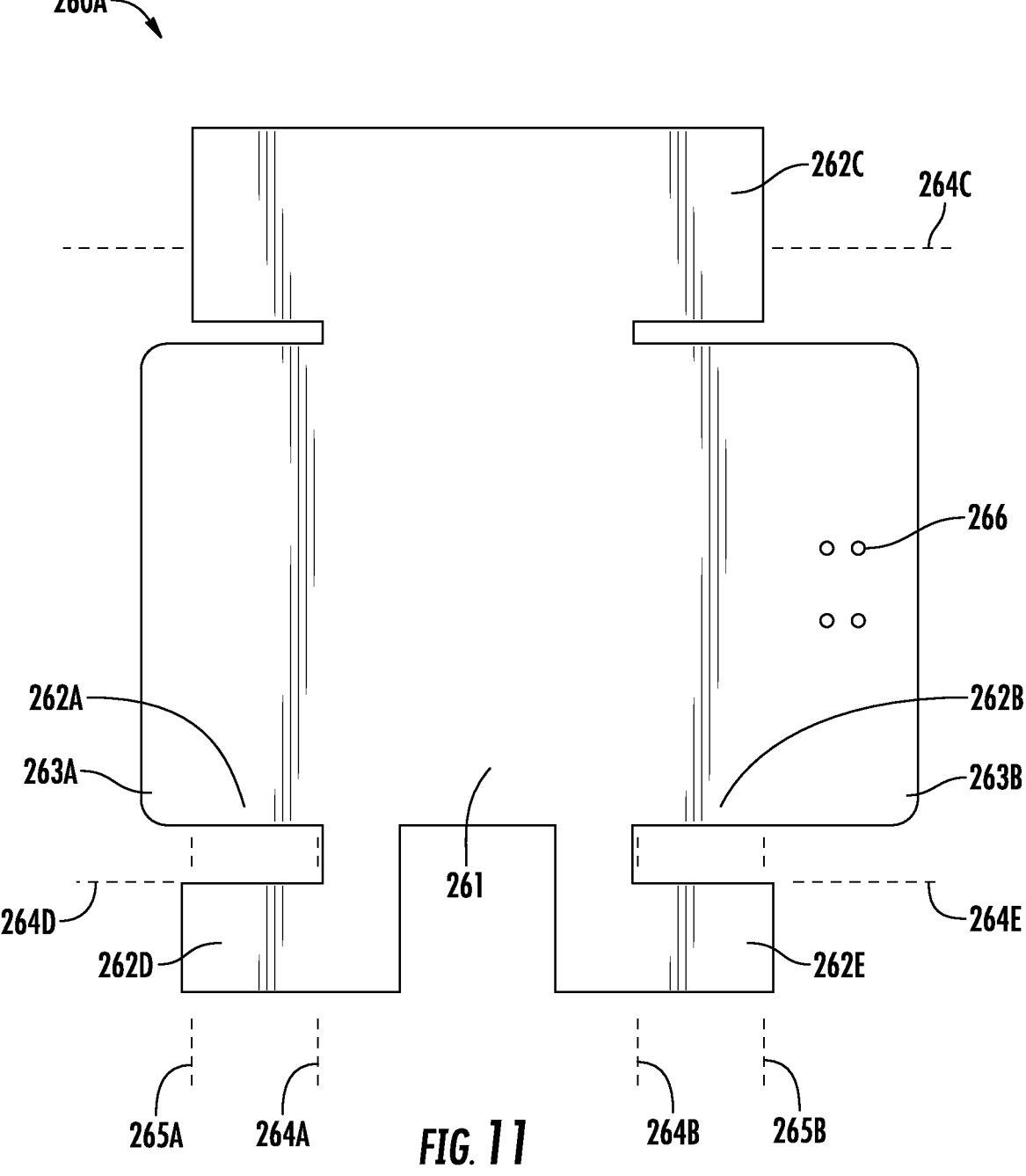
FIG. 11 is a bottom plan view of a roll-bond evaporator in flat form prior to formation of bend areas between panel areas thereof, with superimposed dashed lines corresponding to bend areas to be formed by a bending step.

FIG. 11 is a bottom plan view of a roll-bond evaporator 260A in flat form prior to formation of bend areas between panel areas thereof, with the roll-bond evaporator 260A being similar to the roll-bond evaporator 260 described in connection with FIG. 9, but with additional secondary panel areas 262D-262E. The roll-bond evaporator 260A is shown with superimposed dashed lines 264A-264E, 265A-265B corresponding to bend areas to be formed by a bending step. It is to be understood that the roll-bond evaporator 260 includes a heatpipe channel network (not shown) including heatpipe channels in each of a primary panel area 261 and multiple secondary panel areas 262A-262E. Extension panel areas 263A-263B that may be devoid of heatpipe channels and extend from selected secondary panel areas 262A-262B are also provided, with one extension panel area 263B including mounting holes 266 therein. The secondary panel areas 262A-262E are each configured to receive multiple fins, as shown in FIG. 12.

Figure 12:
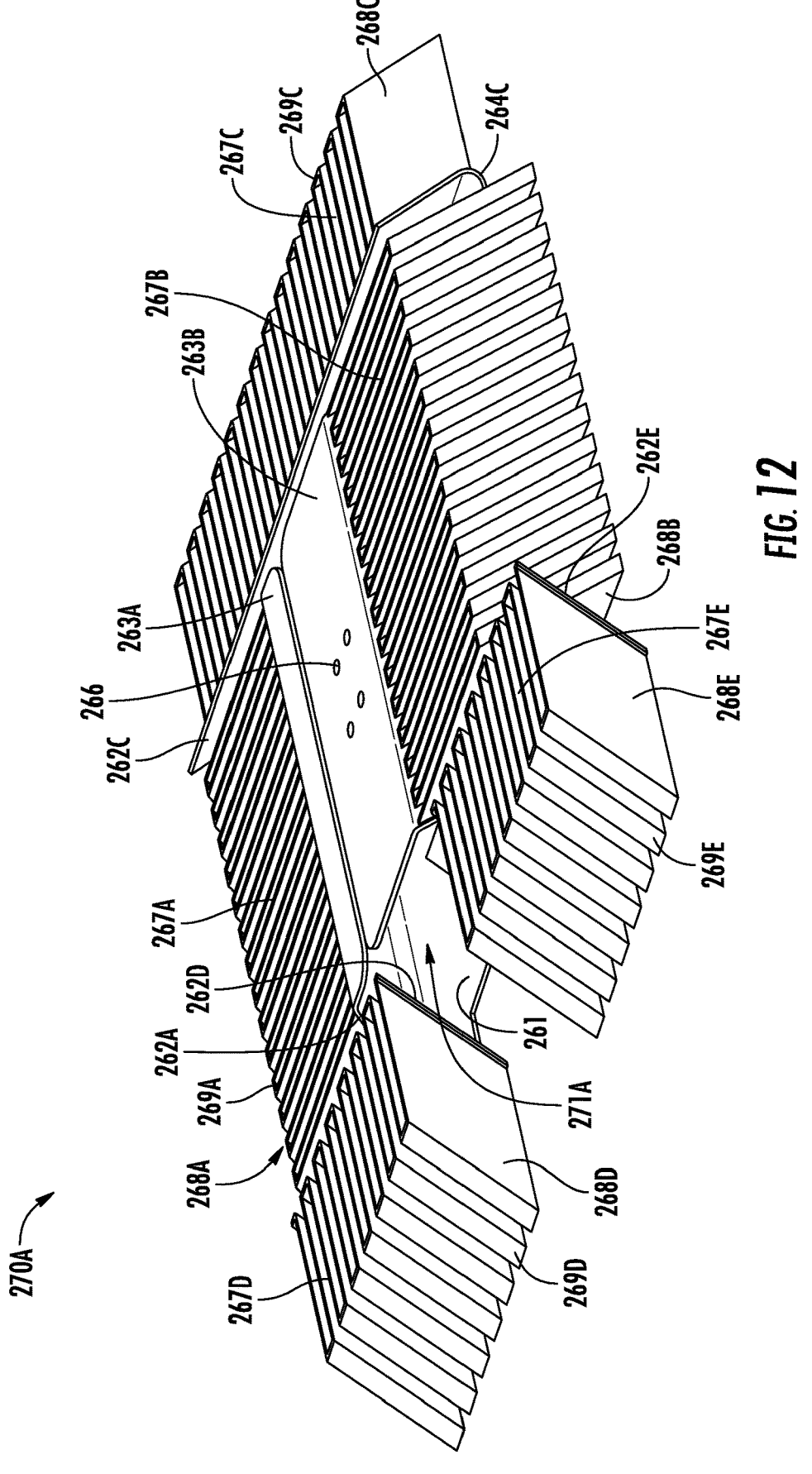
FIG. 12 is a perspective view of a heat exchanger according to one embodiment produced by bending the roll-bond evaporator of FIG. 11 to form first to third secondary panel areas laterally bounding a cavity along three sides, and by joining pluralities of fins to the secondary panel areas.

FIG. 12 is a perspective view of a heat exchanger 270A according to one embodiment, produced by bending the roll-bond evaporator of FIG. 11 (e.g., at bend areas 264A-264E) to cause the five secondary panel areas 262A-262E to laterally bound a cavity 271A along at least portions of four sides thereof, the cavity 271 also being bounded from below by the primary panel area 261, and bounded from above by extension panel areas 263A-263B. The heat exchanger 270A is also produced by joining pluralities of fins 268A-268E to the secondary panel areas 262A-262E. Each plurality of fins 268A-268E comprises folded fins in which fin sections 267A-267E are joined by multiple folds 269A-269E, with fin faces extending in a vertical direction and parallel gaps between adjacent fins to permit passage of air by natural convection. The pluralities of fins 268A-268E may be joined to the secondary panel areas 262A-262E by any suitable technique such as brazing, soldering, thermal epoxy, thermal bonding, etc. Although not shown, it is to be appreciated that a heatpipe channel network 280 is provided, including heatpipe channels extending between the primary panel area 261 and the secondary panel areas 262A-262E. The primary panel area 261 is configured to permit electronic circuitry to be mounted thereto. Mounting holes 266 defined in the extension panel area 263B atop the heat exchanger 270A may be used to mount the heat exchanger 270A to any suitable structure. As compared to the heat exchanger 270 of FIGS. 10A-10B, the heat exchange 270A of FIG. 12 has additional fins to dissipate heat and is therefore expected to be capable of handling higher power electronics and/or permit safe operation in a higher temperature ambient environment.

In certain embodiments, at least one secondary panel of a heat exchanger may be bent or shaped (e.g., by pressing, rolling, etc.) into a substantially cylindrical configuration around a longitudinal axis, and receive multiple fins that are arranged around the longitudinal axis with each fin having a face extending in a direction generally parallel to the longitudinal axis. Such a configuration is well-suited for mounting on a pole (e.g., for mounting a small cell radio node on a streetlamp or similar structure).

Figure 13A:
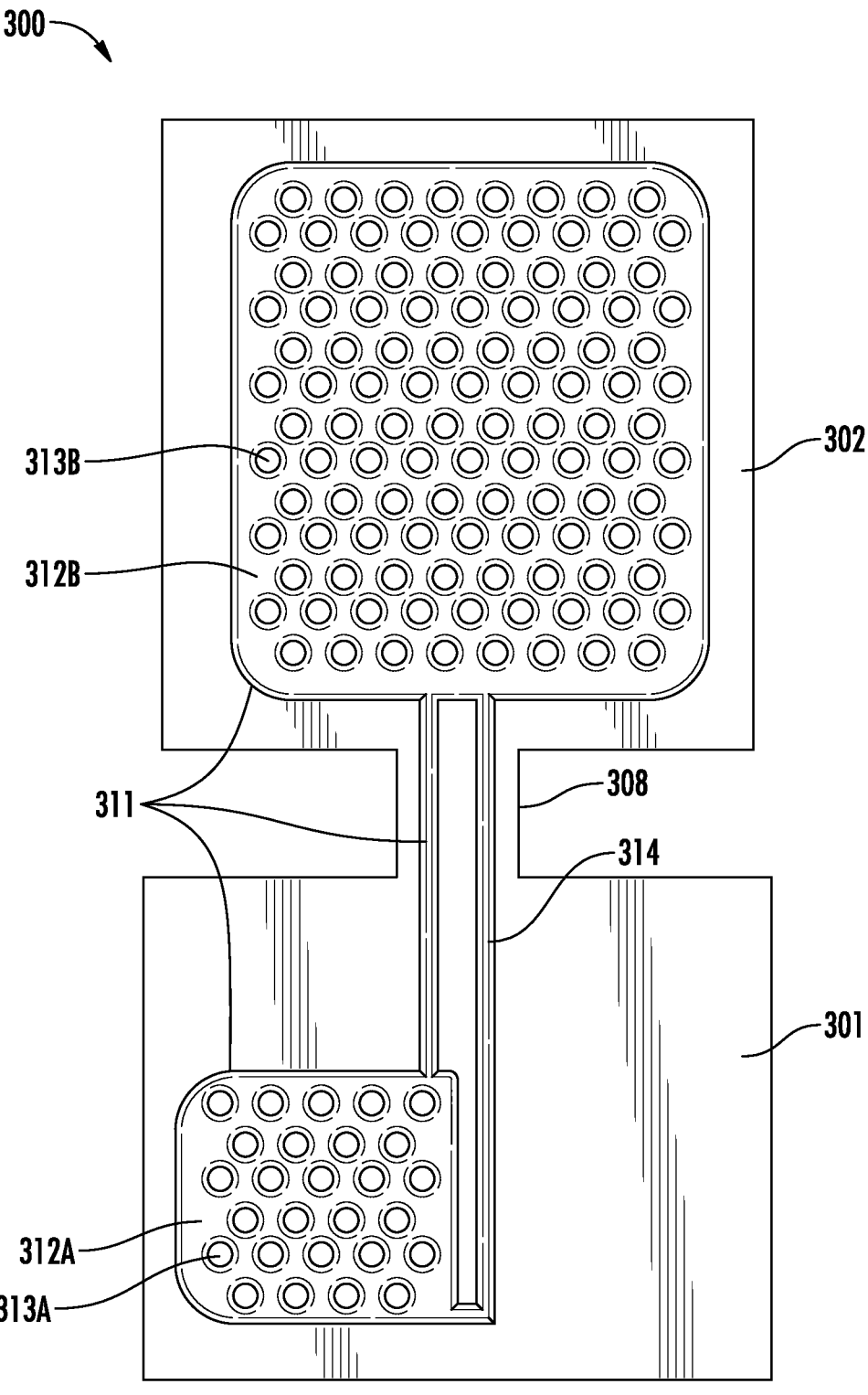
FIG. 13A is a front elevational view of a roll-bond evaporator in flat form, configured for producing a heat exchanger having a cylindrical portion suitable for mounting to a pole.

FIG. 13A is a front elevational view of a roll-bond evaporator 300 in flat form, configured for producing a heat exchanger having a cylindrical portion (i.e., a cylindrical panel area receiving fins) suitable for mounting to a pole (not shown). The roll-bond evaporator 300 includes a primary panel area 301 and a secondary panel area 302, with a heatpipe channel network 311 spanning both panel areas 301, 302. The heatpipe channel network 311 includes a first wide channel region 312A with intermediate bonded areas 313A arranged in the primary panel area 301, a second wide channel region 312B with intermediate bonded areas 313B arranged in the secondary panel area 302, and connecting heatpipe channels 314 extending across a narrowed panel region 308 to connect the wide channel regions 312A, 312B. The intermediate bonded areas 313A, 313B that are recessed relative to the wide channel regions 312A, 312B provide structural support to the wide channel regions 312A, 312B and prevent delamination thereof during expansion (e.g., by pressurized inflation) of the wide channel regions 312A, 312B.

FIG. 13B is bottom plan view of the roll-bond evaporator 300 of FIG. 13A, following bending of the secondary panel area 302 (with the wide channel region 312B) into a substantially cylindrical configuration (bounding a cylindrical cavity 319), while the primary panel area 301 and the wide channel region 312A remains in a flat configuration. An abutment 317 between ends of the secondary panel area 302 may or may not include mechanical coupling of such ends (e.g., by a brazed joint, adhesive material, or the like).

FIG. 13C is a bottom plan view of a heat exchanger 310 incorporating the roll-bond evaporator of FIG. 13B following the joining of a heatsink 315 comprising a plurality of fins 316 to an outer surface of the cylindrical secondary panel area 302 to cause the plurality of fins 316 to project outwardly in a radial configuration. In certain embodiments, the plurality of fins 316 may include preformed fins coupled as groups between retention members 317 periodically arranged (e.g., every ninety degrees) around a perimeter of the secondary panel area 302.

Figure 13D:
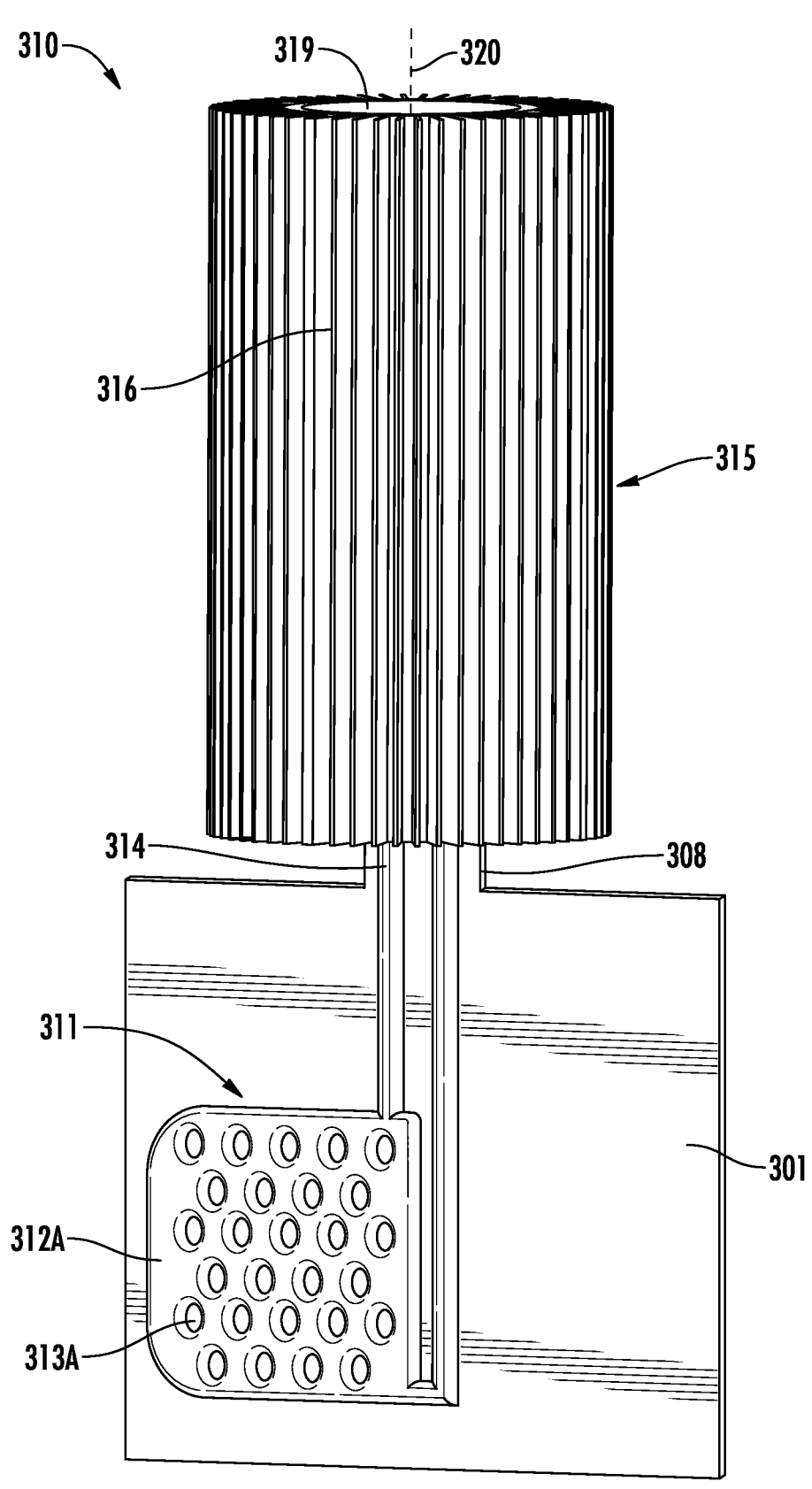
FIG. 13D is a perspective view of the heat exchanger of FIG. 13C with a superimposed longitudinal axis extending through a center of the substantially cylindrical secondary panel area.

FIG. 13D is a perspective view of the heat exchanger 310 of FIG. 13C, including the heatsink 315 composed of a plurality of fins 316 fitted around the secondary panel area (302 in FIG. 13C), with a superimposed longitudinal axis 320 extending through a center of the cylindrical cavity 319 thereof. As shown, the plurality of fins 316 project outwardly in a radial configuration, with each fin 316 having a face extending in a direction generally parallel to the longitudinal axis 320. The primary panel area 301 and first wide channel region 312A remain in a flat configuration, to permit electronic circuitry (e.g., 290 in FIG. 10A) to be mounted thereto. In use, when electronic circuitry is mounted to the primary panel area 301, heat conducted into the first wide channel region 312A serves to evaporate heat exchange fluid therein, and such vaporized fluid is conducted through connecting heatpipe channels 314 to the second wide channel region (312B in FIG. 13A) of the heatpipe channel network 311 where it is condensed, and heat is conducted to the plurality of fins 316 to be dissipated into an ambient air environment surrounding the heat exchanger 310. Vertical gaps between adjacent fins 316 permit movement of air by natural convection.

Figure 13E:
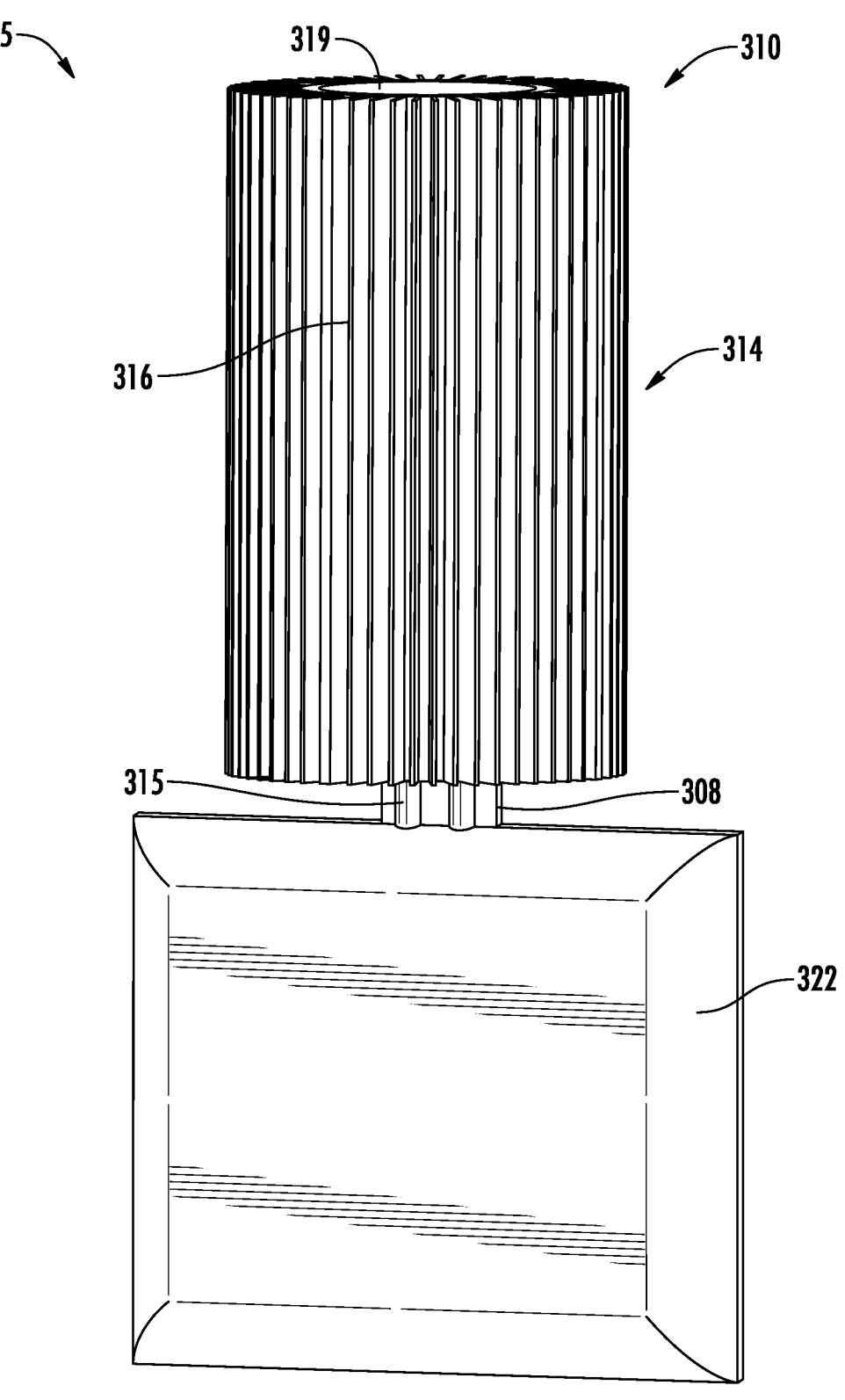
FIG. 13E is a perspective view of the heat exchanger of FIG. 13D following addition of a cover over a primary panel area of the roll-bond evaporator, wherein the cover may be used to protect electronic circuitry of a small cell radio node (not shown) mounted to the primary panel area.
Figure 13F:
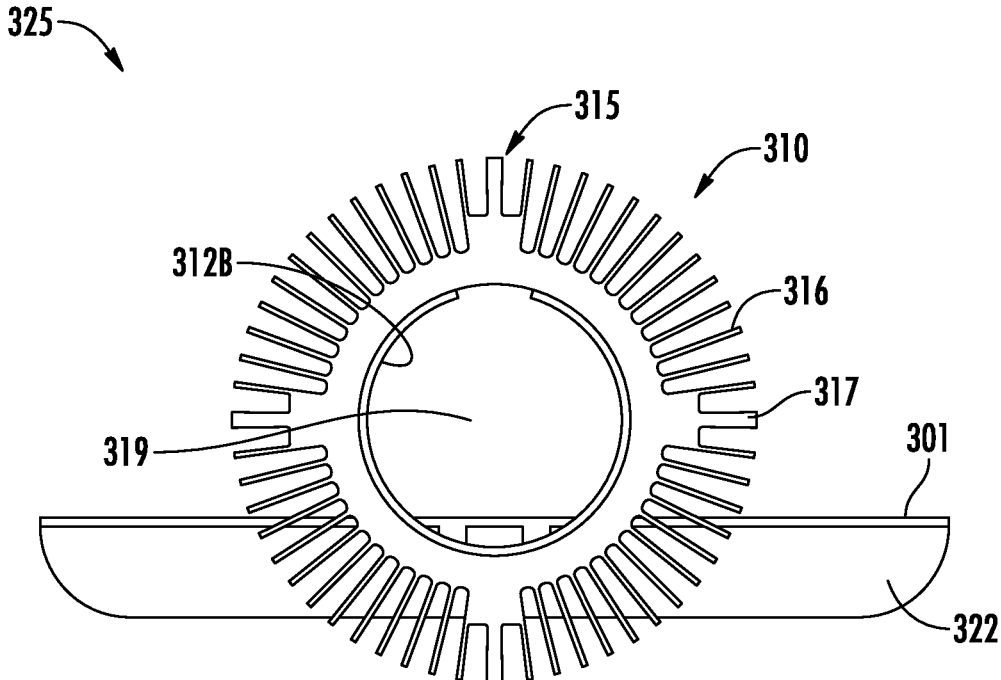
FIG. 13F is a top plan view of the heat exchanger and cover of FIG. 13E.
Figure 14:
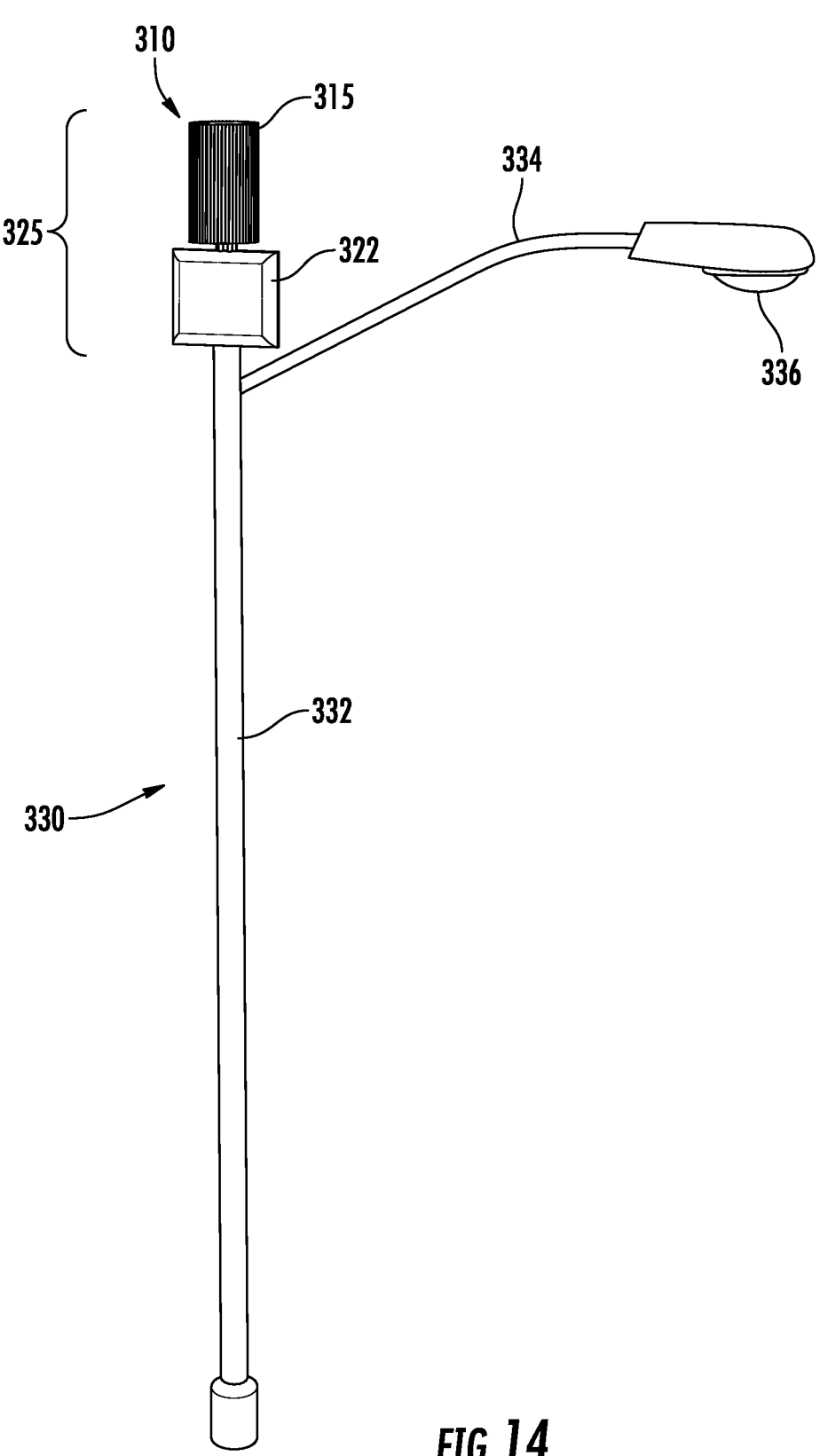
FIG. 14 is a perspective view of a streetlamp having mounted thereon the heat exchanger and cover of FIG. 13E, wherein electronic circuitry below the cover and mounted to the heat exchanger may embody a small cell radio node.

Referring to FIGS. 13E-13F, in certain embodiments, electronic circuitry (e.g., 290 in FIG. 10A) may be mounted to the primary panel area of the heat exchanger 310 and covered with a suitable protective cover to form a small cell radio node 325 that may be mounted to a pole or similar structure, with mounting facilitated by the cylindrical cavity 319 arranged within the heatsink 315 and bounded in part by the second wide channel area 312B of the secondary panel area (302 in FIG. 13D). FIG. 14 is a perspective view of a streetlamp 330, including a pole 332, a pole extension 334, and a lamp 336, with the pole 332 having the small cell radio node 325 mounted thereon with the heatsink 315 arranged above the protective cover 322 (covering electronic circuitry therein).

The remaining elements of FIGS. 13E-13F are the same as described previously in connection with FIGS. 13A-13D. The small cell radio node 325 may be used as part of a wireless communications system (WCS) (which can include a Fifth Generation (5G) system, a New Radio (5G-NR) system, and/or a distributed communications system (DCS)).

Figure 15:
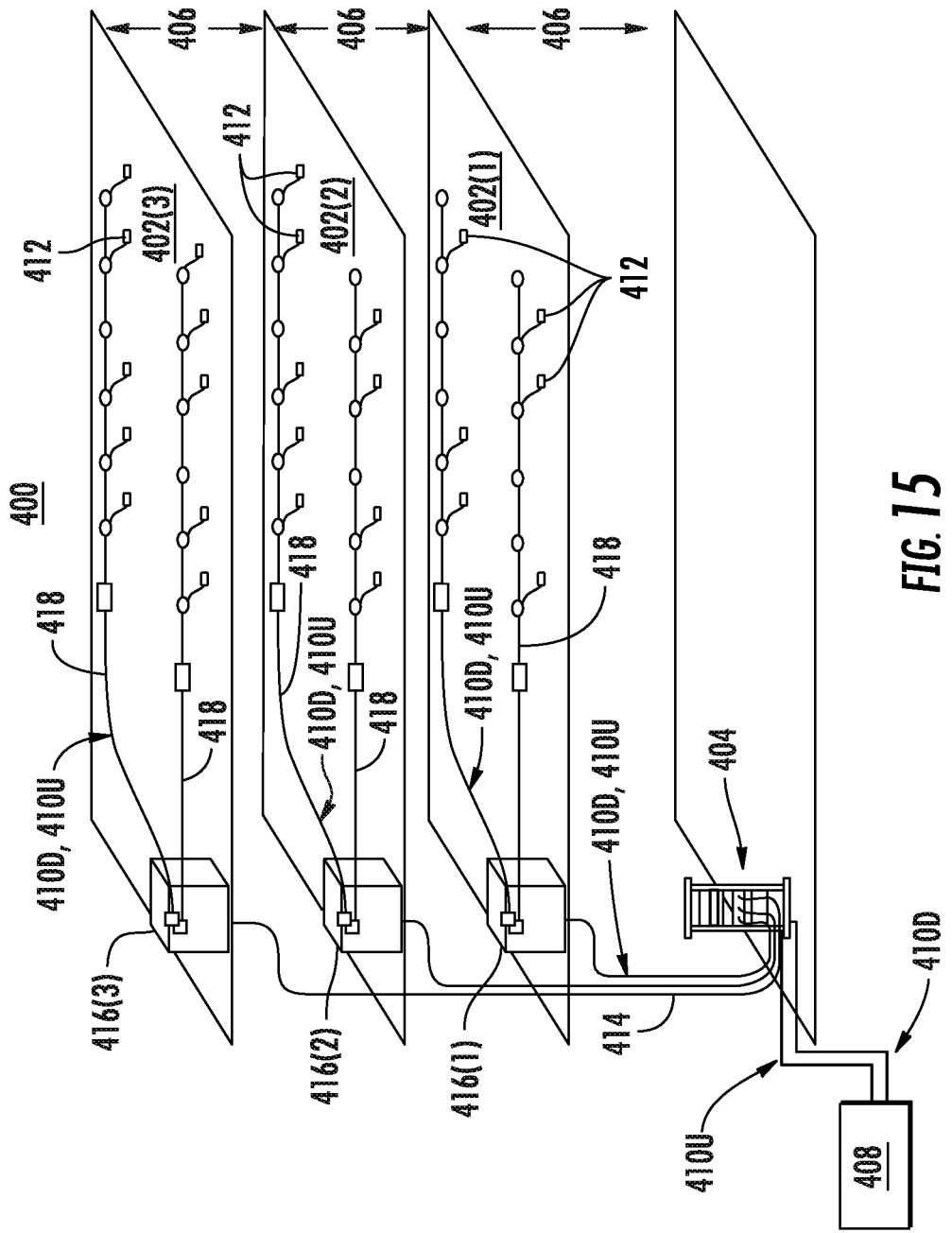
FIG. 15 is a partial schematic cut-away diagram of an exemplary building infrastructure in a wireless communication system (WCS).

A WCS, which can include various wireless devices, can be provided in or encompass an indoor environment as illustrated in FIG. 15. FIG. 15 is a partial schematic cut-away diagram of an exemplary building infrastructure 400 in a WCS. The building infrastructure 400 in this embodiment includes a first (ground) floor 402(1), a second floor 402(2), and a third floor 402(3). The floors 402(1)-402(3) are serviced by a central unit 404 to provide antenna coverage areas 406 in the building infrastructure 400. The central unit 404 is communicatively coupled to a base station 408 to receive downlink communications signals 410D from the base station 408. The central unit 404 is communicatively coupled to a plurality of remote units 412 to distribute the downlink communications signals 410D to the remote units 412 and to receive uplink communications signals 410U from the remote units 412, as previously discussed above. The downlink communications signals 410D and the uplink communications signals 410U communicated between the central unit 404 and the remote units 412 are carried over a riser cable 414. The riser cable 414 may be routed through interconnect units (ICUs) 416(1)-416(3) dedicated to each of the floors 402(1)-402(3) that route the downlink communications signals 410D and the uplink communications signals 410U to the remote units 412 and also provide power to the remote units 412 via array cables 418.

A WCS including the building infrastructure 400 can be interfaced with different types of radio nodes of service providers and/or supporting service providers, including macrocell systems, small cell systems, and remote radio heads (RRH) systems, as examples. For example, FIG. 16 is a schematic diagram of an exemplary mobile telecommunications environment 500 (also referred to as "environment 500") that includes radio nodes and cells that may support shared spectrum, such as unlicensed spectrum, and can be interfaced to shared spectrum WCSs 501 supporting coordination of distribution of shared spectrum from multiple service providers to remote units to be distributed to subscriber devices.

The environment 500 includes exemplary macrocell RANs 502(1)-502(M) ("macrocells 502(1)-502(M)") and an exemplary small cell RAN 504 located within an enterprise environment 506 and configured to service mobile communications between a user mobile communications device 508(1)-508(N) to a mobile network operator (MNO) 510. A serving RAN for the user mobile communications devices 508(1)-508(N) is a RAN or cell in the RAN in which the user mobile communications devices 508(1)-508(N) have an established communications session with the exchange of mobile communications signals for mobile communications. Thus, a serving RAN may also be referred to herein as a serving cell. For example, the user mobile communications devices 508(3)-508(N) in FIG. 16 are being serviced by the small cell RAN 504, whereas the user mobile communications devices 508(1) and 508(2) are being serviced by the macrocell 502, which may be an MNO macrocell. However, a shared spectrum RAN 503 (also referred to as "shared spectrum cell 503") includes a macrocell in this example and supports communications on frequencies that are not solely licensed to a particular MNO, such as CBRS for example, and thus may service user mobile communications devices

508(1)-508(N) independent of a particular MNO. For example, the shared spectrum cell 503 may be operated by a third party that is not an MNO and wherein the shared spectrum cell 503 supports CBRS. Also, as shown in FIG. 16, the MNO macrocell 502, the shared spectrum cell 503, and/or the small cell RAN 504 can interface with a shared spectrum WCS 501 supporting coordination of distribution of shared spectrum from multiple service providers to remote units to be distributed to subscriber devices. The MNO macrocell 502, the shared spectrum cell 503, and the small cell RAN 504 may be neighboring radio access systems to each other, meaning that some or all can be in proximity to each other such that a user mobile communications device 508(3)-508(N) may be able to be in communications range of two or more of the MNO macrocell 502, the shared spectrum cell 503, and the small cell RAN 504 depending on the location of the user mobile communications devices 508(3)-508(N).

Figure 16:
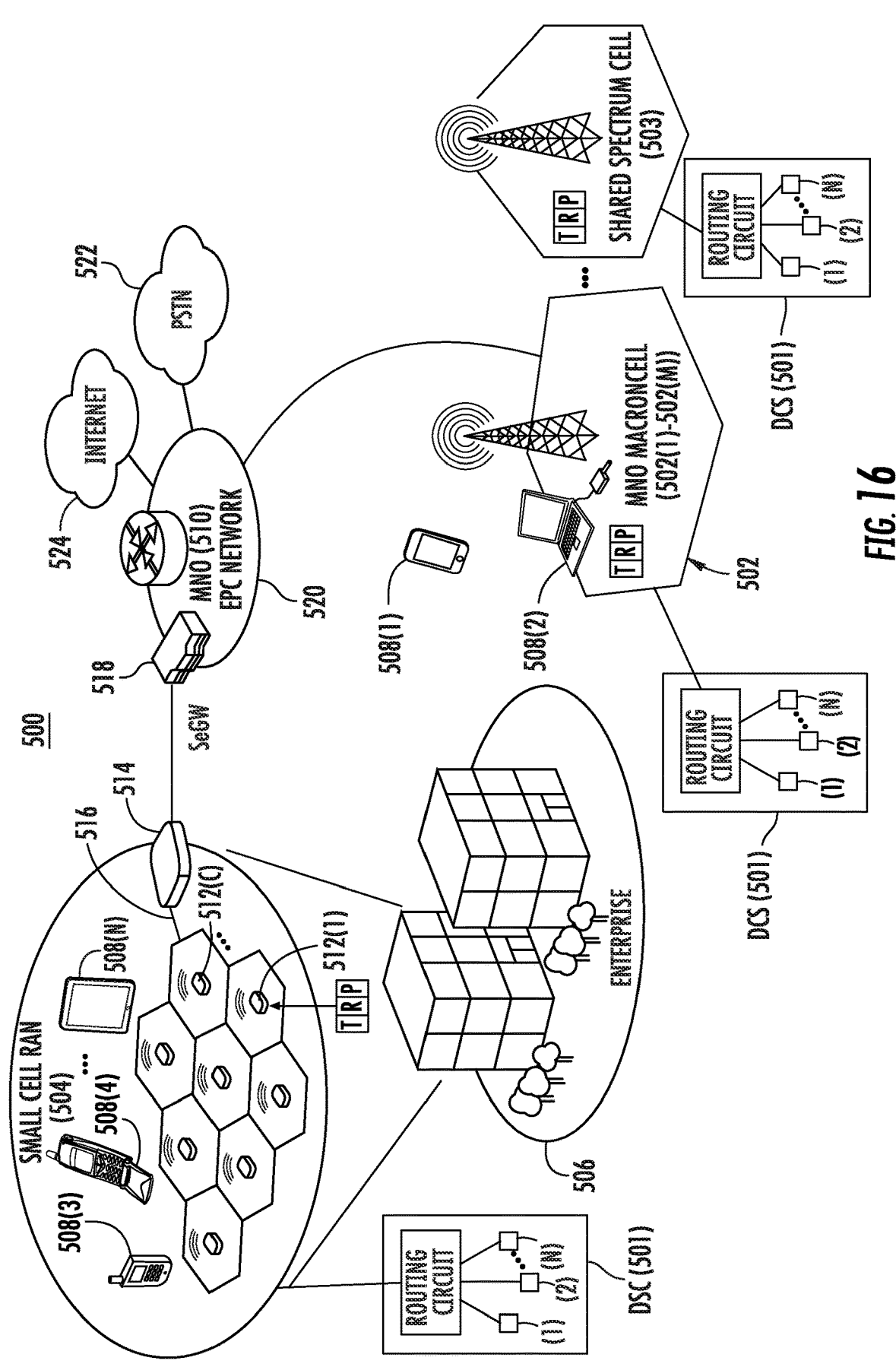
FIG. 16 is a schematic diagram of an exemplary mobile telecommunications environment that includes a WCS.

In FIG. 16, the mobile telecommunications environment 500 in this example is arranged as an LTE system as described by the Third Generation Partnership Project (3GPP) as an evolution of the GSM/UMTS standards (Global System for Mobile communication/Universal Mobile Telecommunications System). It is emphasized, however, that the aspects described herein may also be applicable to other network types and protocols. The mobile telecommunications environment 500 includes the enterprise environment 506 in which the small cell RAN 504 is implemented. The small cell RAN 504 includes a plurality of small cell radio nodes 512(1)-512(C). Each small cell radio node 512(1)-512(C) has a radio coverage area (graphically depicted in the drawings as a hexagonal shape) that is commonly termed a "small cell." A small cell may also be referred to as a femtocell or, using terminology defined by 3GPP, as a Home Evolved Node B (HeNB). In the description that follows, the term "cell" typically means the combination of a radio node and its radio coverage area unless otherwise indicated.

In FIG. 16, the small cell RAN 504 includes one or more services nodes (represented as a single services node 514 that manage and control the small cell radio nodes 512(1)-512(C). In alternative implementations, the management and control functionality may be incorporated into a radio node, distributed among nodes, or implemented remotely (i.e., using infrastructure external to the small cell RAN 504). The small cell radio nodes 512(1)-512(C) are coupled to the services node 514 over a direct or local area network (LAN) connection 516 as an example, typically using secure IPsec tunnels. The small cell radio nodes 512(1)-512(C) can include multi-operator radio nodes. The services node 514 aggregates voice and data traffic from the small cell radio nodes 512(1)-512(C) and provides connectivity over an IPsec tunnel to a security gateway (SeGW) 518 in a network 520 (e.g., evolved packet core (EPC) network in a 4G network, or 5G Core in a 5G network) of the MNO 510. The network 520 is typically configured to communicate with a public switched telephone network (PSTN) 522 to carry circuit-switched traffic, as well as for communicating with an external packet-switched network such as the Internet 524.

The environment 500 also generally includes a node (e.g., eNodeB or gNodeB) base station, or "macrocell" 502. The radio coverage area of the macrocell 502 is typically much larger than that of a small cell where the extent of coverage often depends on the base station configuration and surrounding geography. Thus, a given user mobile communications device 508(3)-508(N) may achieve connectivity to the network 520 (e.g., EPC network in a 4G network, or 5G Core in a 5G network) through either a macrocell 502 or small cell radio node 512(1)-512(C) in the small cell RAN 504 in the environment 500.

Figure 17:
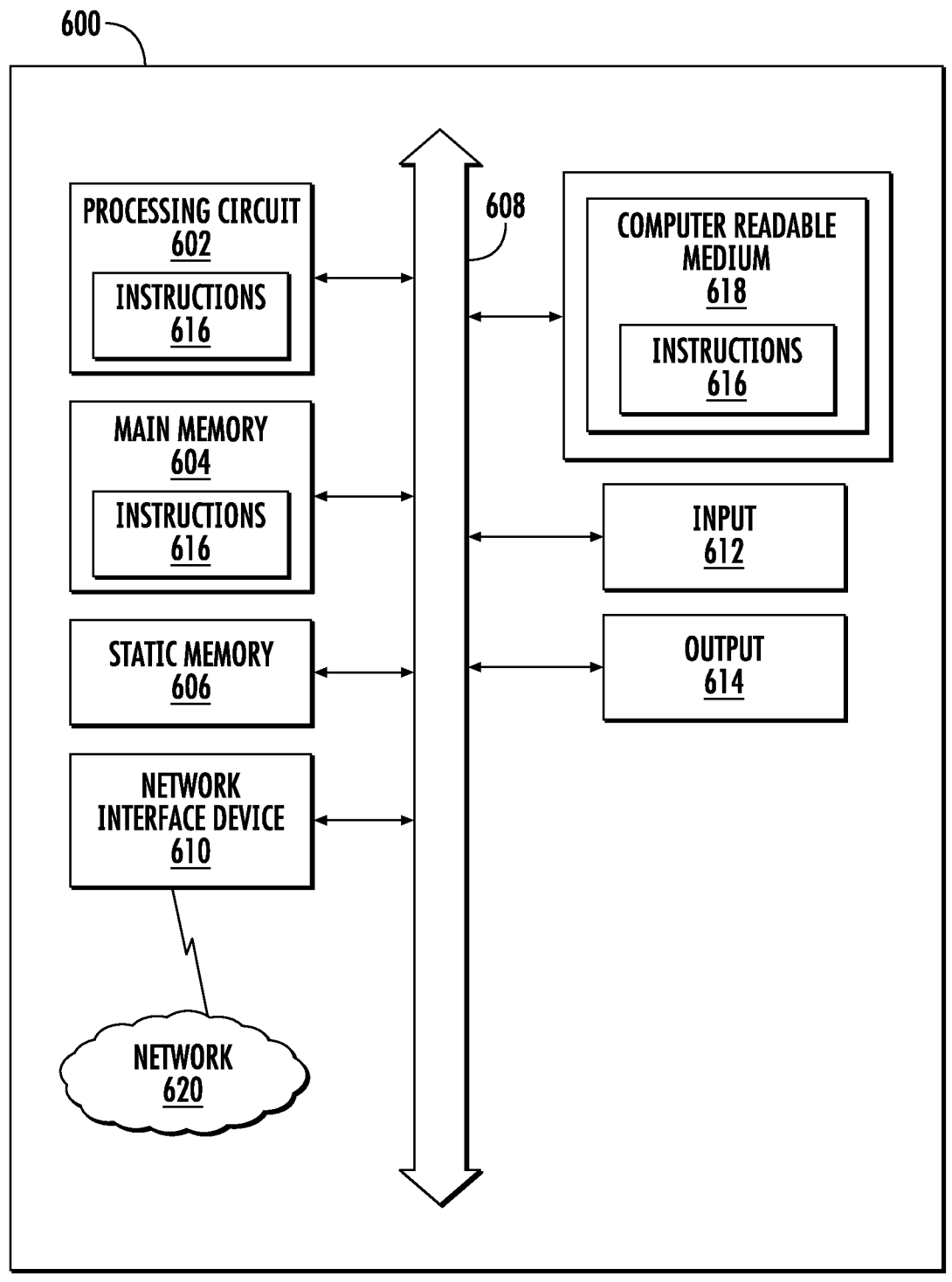
FIG. 17 is a schematic diagram of a representation of an exemplary computer system that can be included in or interfaced with electronic circuitry described herein.

Any of the electronic circuitry described herein can include a computer system (such as the computer system 600 shown in FIG. 17) to carry out their functions and operations. Such a computer system may include a set of instructions for causing the multi-operator radio node component(s) to provide its designed functionality, and the circuits discussed above. The multi-operator radio node component(s) may be connected (e.g., networked) to other machines in a LAN, an intranet, an extranet, or the Internet. The multi-operator radio node component(s) may operate in a client-server network environment, or as a peer machine in a peer-to-peer (or distributed) network environment. The term "device" shall also be taken to include any collection of devices that individually or jointly execute a set (or multiple sets) of instructions to perform any one or more of the methodologies discussed herein. The multi-operator radio node component(s) may be a circuit or circuits included in an electronic board card, such as a printed circuit board (PCB) as an example, a server, a personal computer, a desktop computer, a laptop computer, a personal digital assistant (PDA), a computing pad, a mobile device, or any other device, and may represent, for example, a server, edge computer, or a user's computer. The exemplary computer system 600 in this embodiment includes a processing circuit or processor 602, a main memory 604 (e.g., read-only memory (ROM), flash memory, dynamic random access memory (DRAM) such as synchronous DRAM (SDRAM), etc.), and a static memory 606 (e.g., flash memory, static random access memory (SRAM), etc.), which may communicate with each other via a data bus 608. Alternatively, the processing circuit 602 may be connected to the main memory 604 and/or static memory 606 directly or via some other connectivity means. The processing circuit 602 may be a controller, and the main memory 604 or static memory 606 may be any type of memory.

The processing circuit 602 represents one or more general-purpose processing circuits such as a microprocessor, central processing unit, or the like. More particularly, the processing circuit 602 may be a complex instruction set computing (CISC) microprocessor, a reduced instruction set computing (RISC) microprocessor, a very long instruction word (VLIW) microprocessor, a processor implementing other instruction sets, or processors implementing a combination of instruction sets. The processing circuit 602 is configured to execute processing logic in instructions 616 for performing the operations and steps discussed herein.

The computer system 600 may further include a network interface device 610. The computer system 600 also may or may not include an input 612 to receive input and selections to be communicated to the computer system 600 when executing instructions. The computer system 600 also may or may not include an output 614, including but not limited to a display, a video display unit, an alphanumeric input device (e.g., a keyboard), and/or a cursor control device (e.g., a mouse).

The computer system 600 may or may not include a data storage device that includes instructions 616 stored in a computer-readable medium 618. The instructions 616 may also reside, completely or at least partially, within the main memory 604 and/or within the processing circuit 602 during execution thereof by the computer system 600, the main memory 604 and the processing circuit 602 also constituting the computer-readable medium 618. The instructions 616 may further be transmitted or received over a network 620 via the network interface device 610.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that any particular order be inferred.

It will be apparent to those skilled in the art that various modifications and variations can be made without departing from the spirit or scope of the invention. Since modifications combinations, sub-combinations and variations of the disclosed embodiments incorporating the spirit and substance of the invention may occur to persons skilled in the art, the invention should be construed to include everything within the scope of the appended claims and their equivalents.

We claim:

1. An electronic device comprising:
   electronic circuitry; and
   a heat exchanger comprising a roll-bond evaporator that comprises:
   a first metallic sheet and a second metallic sheet distinct from the first metallic sheet, the second metallic sheet overlapping and bonded to the first metallic sheet, the sheets jointly defining a primary panel area and at least one secondary panel area, wherein the at least one secondary panel area is one of a plurality of secondary panel areas, and
   a heatpipe channel network arranged along an interface between the bonded first and second metallic sheets, wherein the heatpipe channel network comprises first heatpipe channels arranged in the primary panel area and second heatpipe channels arranged in the at least one secondary panel area, the second heatpipe channels being in fluid communication with the first heatpipe channels; and
   at least one plurality of fins joined to the at least one secondary panel area, wherein the at least one plurality of fins are joined by a plurality of folds with fin faces extending in a vertical direction; wherein the electronic circuitry is mounted on the primary panel area and within a cavity formed by the primary panel area in combination with the plurality of secondary panel areas to permit heat generated by the electronic circuitry to be conveyed into the first heatpipe channels.

2. The electronic device of claim 1, wherein the at least one secondary panel area is non-coplanar with the primary panel area.

3. The electronic device of claim 2, wherein the roll-bond evaporator comprising at least one bend area arranged between the primary panel area and the at least one secondary panel area.

4. The electronic device of claim 3, wherein the heatpipe channel network extends through the at least one bend area and provides fluid communication between the first heatpipe channels and the second heatpipe channels.

5. The electronic device of claim 3, wherein the heat exchanger further comprises a conduit external to the first and second metal sheets, and wherein the conduit provides fluid communication between the first heatpipe channels and the second heatpipe channels.

6. The electronic device of claim 1, wherein:
   the at least one secondary panel area comprises first and second secondary panel areas; and the at least one plurality of fins comprises a first plurality of fins joined to the first secondary panel area and comprises a second plurality of fins joined to the second secondary panel area.

7. The electronic device of claim 1, wherein each fin of the at least one plurality of fins comprises a thickness of no greater than 2 mm.

8. The electronic device of claim 1, wherein the primary panel area includes at least one cutout configured to receive components associated with the electronic circuitry.

9. The electronic device of claim 1, wherein the at least one plurality of fins is configured to dissipate at least 5 watts into an ambient air environment in which the heat exchanger is located.

10. The electronic device of claim 1, wherein the at least one secondary panel area is provided in a substantially cylindrical configuration around a longitudinal axis, and the at least one plurality of fins comprises multiple fins that are radially arranged around the longitudinal axis, with each fin having a face extending in a direction generally parallel to the longitudinal axis.

11. The electronic device of claim 1, wherein the at least one secondary panel area comprises the plurality of secondary panel areas that are non-coplanar with the primary panel area.

12. The electronic device of claim 1, wherein the heatpipe channel network contains a heat exchange fluid, the primary panel area comprises an evaporator region configured to evaporate the heat exchange fluid, and the at least one secondary panel area comprises a condenser region configured to condense the heat exchange fluid.

13. A radio node comprising the electronic device of claim 1 wherein:

the electronic circuitry comprises radio circuitry configured to distribute wireless communication signal streams to multiple wireless client devices.

14. An electronic device fabrication method comprising:

defining a heatpipe channel network along an interface between bonded first and second planar metallic sheets to produce a roll-bond evaporator, the heatpipe channel network comprising first heatpipe channels arranged in a primary panel area of the roll-bond evaporator, and comprising second heatpipe channels arranged in at least one secondary panel area of the roll-bond evaporator, wherein the at least one secondary panel area is one of a plurality of secondary panel areas;

joining at least one plurality of fins to the at least one secondary panel area, wherein the at least one plurality of fins are joined by a plurality of folds with fin faces extending in a vertical direction; and mounting electronic circuitry on the primary panel area and within a cavity formed by the primary panel area in combination with the plurality of secondary panel areas to permit heat generated by the electronic circuitry to be conveyed into the first heatpipe channels.

15. The electronic device fabrication method of claim 14, further comprising forming at least one bend area in the roll-bond evaporator arranged between the primary panel area and the at least one secondary panel area, to cause the at least one secondary panel area to be non-coplanar with the primary panel area.

16. The electronic device fabrication method of claim 15, further comprising providing a conduit external to the first and second metal sheets, the conduit providing fluid communication between the first heatpipe channels and the second heatpipe channels.

17. The electronic device fabrication method of claim 14, wherein the joining of the at least one plurality of fins to the at least one secondary panel area is performed by one or more of brazing, thermal bonding, and adhesive bonding.

18. The electronic device fabrication method of claim 14, wherein the method further comprises:

providing bend areas between the plurality of secondary panel areas and the primary panel area to form the cavity bounded by the plurality of secondary panel areas and the primary panel area.

19. The electronic device fabrication method of claim 14, further comprising:

shaping the at least one secondary panel area into a substantially cylindrical configuration around a longitudinal axis; and causing the at least one plurality of fins to be radially arranged around the longitudinal axis, with each fin having a face extending in a direction generally parallel to the longitudinal axis.

20. The electronic device fabrication method of claim 14, wherein the electronic circuitry comprises radio circuitry configured to distribute wireless communication signal streams to multiple wireless client devices.

* * * * *